United States Patent
Roy et al.

(10) Patent No.: US 12,267,996 B2
(45) Date of Patent: Apr. 1, 2025

(54) DRAM SENSE AMPLIFIER ARCHITECTURE WITH REDUCED POWER CONSUMPTION AND RELATED METHODS

(71) Applicant: Atomera Incorporated, Los Gatos, CA (US)

(72) Inventors: Richard Stephen Roy, Lago Vista, TX (US); Robert J. Mears, Wellesley, MA (US)

(73) Assignee: Atomera Incorporated, Los Gatos, CA (US)

( * ) Notice: Subject to any disclaimer, the term of this patent is extended or adjusted under 35 U.S.C. 154(b) by 191 days.

(21) Appl. No.: 18/311,465

(22) Filed: May 3, 2023

(65) Prior Publication Data

US 2023/0363150 A1 Nov. 9, 2023

Related U.S. Application Data

(60) Provisional application No. 63/366,262, filed on Jun. 13, 2022, provisional application No. 63/364,120, filed on May 4, 2022.

(51) Int. Cl.
*G11C 11/24* (2006.01)
*G11C 11/406* (2006.01)
(Continued)

(52) U.S. Cl.
CPC ............ *H10B 12/50* (2023.02); *G11C 11/406* (2013.01); *G11C 11/4091* (2013.01); *H01L 25/0657* (2013.01); *H10B 80/00* (2023.02)

(58) Field of Classification Search
CPC ...... H10B 12/50; H10B 80/00; G11C 11/406; G11C 11/4091; H01L 25/0657
(Continued)

(56) References Cited

U.S. PATENT DOCUMENTS 4,937,204 A 6/1990 Ishibashi et al.
5,216,262 A 6/1993 Tsu
(Continued)

FOREIGN PATENT DOCUMENTS

GB 2347520 6/2000
TW I585774 B 6/2017

OTHER PUBLICATIONS

R. Tsu "Phenomena in silicon nanostructure device" published online Sep. 6, 2000 by Applied Physics and Materials Science & Processing, pp. 391-402.
(Continued)

*Primary Examiner* — Viet Q Nguyen
(74) *Attorney, Agent, or Firm* — Bever, Hoffman and Harms, LLP

(57) ABSTRACT

A dynamic random access memory (DRAM) device may include an array of DRAM cells, with each DRAM cell configured to store a high logic voltage and a low logic voltage. The DRAM device may further include a precharge circuit configured to selectively provide a first reference voltage and a second reference voltage to a first line and a second line, respectively, and a sense amplifier comprising a cross-coupled transistor sensing circuit coupled between the first line and second line. The sense amplifier may include at least one transistor including a superlattice channel. The DRAM device may further include a refresh circuit configured to selectively couple a third reference voltage to a corresponding DRAM cell via the first line and based upon a voltage difference between the first line and the second line, with the third reference voltage being greater than the high logic voltage of the DRAM cell.

26 Claims, 36 Drawing Sheets

(51) Int. Cl.
*G11C 11/4091* (2006.01)
*H01L 25/065* (2023.01)
*H10B 12/00* (2023.01)
*H10B 80/00* (2023.01)

(58) Field of Classification Search
USPC .......................................................... 365/149
See application file for complete search history.

(56) References Cited

U.S. PATENT DOCUMENTS

| | | | |
|---|---|---|---|
| 5,262,999 A * | 11/1993 | Etoh | G11C 11/4096 365/229 |
| 5,357,119 A | 10/1994 | Wang et al. | |
| 5,438,543 A * | 8/1995 | Yoon | G11C 11/4091 365/189.11 |
| 5,683,934 A | 11/1997 | Candelaria | |
| 5,712,825 A * | 1/1998 | Hadderman | G11C 11/406 365/222 |
| 5,796,119 A | 8/1998 | Seabaugh | |
| 5,822,264 A * | 10/1998 | Tomishima | G11C 11/406 365/230.03 |
| 6,058,061 A * | 5/2000 | Ooishi | G11C 11/4091 365/222 |
| 6,111,803 A * | 8/2000 | Derner | G11C 7/062 365/207 |
| 6,226,754 B1 * | 5/2001 | Ware | G11C 7/22 713/400 |
| 6,376,337 B1 | 4/2002 | Wang et al. | |
| 6,447,933 B1 | 9/2002 | Wang et al. | |
| 6,472,685 B2 | 10/2002 | Takagi | |
| 6,636,454 B2 * | 10/2003 | Fujino | G11C 11/4094 365/231 |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,402,512 B2 | 7/2008 | Derraa et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,535,041 B2 | 5/2009 | Blanchard | |
| 7,570,531 B2 * | 8/2009 | Nakamura | G11C 7/08 365/207 |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,848,166 B2 * | 12/2010 | Hsu | G11C 11/4097 365/204 |
| 7,863,066 B2 | 1/2011 | Mears et al. | |
| 7,880,161 B2 | 2/2011 | Mears et al. | |
| 7,928,425 B2 | 4/2011 | Rao | |
| 7,929,367 B2 * | 4/2011 | Yoo | G11C 11/406 365/207 |
| 8,164,941 B2 * | 4/2012 | Kang | G11C 11/22 365/145 |
| 8,389,974 B2 | 3/2013 | Mears et al. | |
| 8,605,532 B2 * | 12/2013 | Kajigaya | G11C 11/4097 365/185.21 |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,716,147 B2 | 7/2017 | Mears | |
| 9,721,790 B2 | 8/2017 | Mears et al. | |
| 9,722,046 B2 | 8/2017 | Mears et al. | |
| 9,899,479 B2 | 2/2018 | Mears et al. | |
| 9,941,359 B2 | 4/2018 | Mears et al. | |
| 9,972,685 B2 | 5/2018 | Mears et al. | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 10,170,560 B2 | 1/2019 | Mears | |
| 10,170,603 B2 | 1/2019 | Mears et al. | |
| 10,170,604 B2 | 1/2019 | Mears et al. | |
| 10,191,105 B2 | 1/2019 | Roy | |
| 10,249,745 B2 | 4/2019 | Mears et al. | |
| 10,276,625 B1 | 4/2019 | Mears et al. | |
| 10,304,881 B1 | 5/2019 | Chen et al. | |
| 10,355,151 B2 | 7/2019 | Chen et al. | |
| 10,361,243 B2 | 7/2019 | Mears et al. | |
| 10,367,028 B2 | 7/2019 | Chen et al. | |
| 10,367,064 B2 | 7/2019 | Rao | |
| 10,381,242 B2 | 8/2019 | Takeuchi | |
| 10,396,223 B2 | 8/2019 | Chen et al. | |
| 10,410,880 B2 | 9/2019 | Takeuchi | |
| 10,453,945 B2 | 10/2019 | Mears et al. | |
| 10,461,118 B2 | 10/2019 | Chen et al. | |
| 10,468,245 B2 | 11/2019 | Weeks et al. | |
| 10,529,757 B2 | 1/2020 | Chen et al. | |
| 10,529,768 B2 | 1/2020 | Chen et al. | |
| 10,566,191 B1 | 2/2020 | Weeks et al. | |
| 10,580,866 B1 | 3/2020 | Takeuchi et al. | |
| 10,580,867 B1 | 3/2020 | Takeuchi et al. | |
| 10,593,761 B1 | 3/2020 | Takeuchi et al. | |
| 10,608,027 B2 | 3/2020 | Chen et al. | |
| 10,608,043 B2 | 3/2020 | Chen et al. | |
| 10,615,209 B2 | 4/2020 | Chen et al. | |
| 10,622,057 B2 * | 4/2020 | Kawamura | G11C 11/4091 |
| 10,636,879 B2 | 4/2020 | Rao | |
| 10,727,049 B2 | 7/2020 | Weeks et al. | |
| 10,741,436 B2 | 8/2020 | Stephenson et al. | |
| 10,763,370 B2 | 9/2020 | Stephenson | |
| 10,777,451 B2 | 9/2020 | Stephenson et al. | |
| 10,811,498 B2 | 10/2020 | Weeks et al. | |
| 10,818,755 B2 | 10/2020 | Takeuchi et al. | |
| 10,825,901 B1 | 11/2020 | Burton et al. | |
| 10,825,902 B1 | 11/2020 | Burton et al. | |
| 10,840,335 B2 | 11/2020 | Takeuchi et al. | |
| 10,840,336 B2 | 11/2020 | Connelly et al. | |
| 10,840,337 B2 | 11/2020 | Takeuchi et al. | |
| 10,840,388 B1 | 11/2020 | Burton et al. | |
| 10,847,618 B2 | 11/2020 | Takeuchi et al. | |
| 10,854,717 B2 | 12/2020 | Takeuchi et al. | |

(56) References Cited

U.S. PATENT DOCUMENTS

| | | |
|---|---|---|
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 11,075,078 B1 | 7/2021 | Cody et al. |
| 11,094,355 B1 | 8/2021 | Simon et al. |
| 11,094,818 B2 | 8/2021 | Takeuchi et al. |
| 11,177,351 B2 | 11/2021 | Weeks et al. |
| 11,183,565 B2 | 11/2021 | Burton et al. |
| 11,302,823 B2 | 4/2022 | Weeks et al. |
| 11,329,154 B2 | 5/2022 | Takeuchi et al. |
| 11,355,667 B2 | 6/2022 | Stephenson |
| 11,362,182 B2 | 6/2022 | Shin et al. |
| 11,387,325 B2 | 7/2022 | Stephenson et al. |
| 11,430,869 B2 | 8/2022 | Weeks et al. |
| 11,437,486 B2 | 9/2022 | Burton |
| 11,437,487 B2 | 9/2022 | Burton |
| 11,469,302 B2 | 10/2022 | Takeuchi et al. |
| 11,569,368 B2 | 1/2023 | Takeuchi et al. |
| 11,631,584 B1 | 4/2023 | Hytha et al. |
| 11,664,427 B2 | 5/2023 | Stephenson et al. |
| 11,664,459 B2 | 5/2023 | Stephenson |
| 2003/0034529 A1 | 2/2003 | Fitzgerald et al. |
| 2003/0057416 A1 | 3/2003 | Currie et al. |
| 2004/0262594 A1 | 12/2004 | Mears et al. |
| 2004/0266116 A1 | 12/2004 | Mears |
| 2005/0029510 A1 | 2/2005 | Mears et al. |
| 2005/0032241 A1 | 2/2005 | Mears et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0231857 A1 | 10/2006 | Blanchard |
| 2006/0243963 A1 | 11/2006 | Kreps et al. |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard |
| 2007/0007508 A1 | 1/2007 | Mears et al. |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Stephenson et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2010/0270535 A1 | 10/2010 | Halilov et al. |
| 2011/0063891 A1 | 3/2011 | Kajigaya |
| 2011/0184688 A1 | 7/2011 | Uetake et al. |
| 2011/0215299 A1 | 9/2011 | Rao |
| 2011/0248697 A1 | 10/2011 | Kajigaya et al. |
| 2013/0094272 A1 | 4/2013 | Riho |
| 2013/0240744 A1 | 9/2013 | Hurst, Jr. et al. |
| 2014/0169069 A1 | 6/2014 | Oh |
| 2017/0148498 A1 | 5/2017 | Nishioka et al. |
| 2017/0301679 A1 | 10/2017 | Masuoka et al. |
| 2019/0043869 A1 | 2/2019 | Masuoka et al. |
| 2019/0058059 A1 | 2/2019 | Stephenson et al. |
| 2019/0157166 A1 | 5/2019 | Masuoka et al. |
| 2019/0370645 A1 | 12/2019 | Lee et al. |
| 2020/0135489 A1 | 4/2020 | Weeks et al. |
| 2020/0258897 A1 | 8/2020 | Yan et al. |
| 2020/0321047 A1 | 10/2020 | Best et al. |
| 2022/0005706 A1 | 1/2022 | Weeks et al. |
| 2022/0005926 A1 | 1/2022 | Weeks et al. |
| 2022/0005927 A1 | 1/2022 | Weeks et al. |
| 2022/0238710 A1 | 7/2022 | Takeuchi et al. |
| 2022/0278204 A1 | 9/2022 | Shin et al. |
| 2022/0285152 A1 | 9/2022 | Takeuchi et al. |
| 2022/0285153 A1 | 9/2022 | Takeuchi et al. |
| 2022/0285367 A1 | 9/2022 | Fackenthal |
| 2022/0344155 A1 | 10/2022 | Hytha et al. |
| 2022/0352322 A1 | 11/2022 | Hytha et al. |
| 2022/0367675 A1 | 11/2022 | Burton |
| 2022/0367676 A1 | 11/2022 | Burton |
| 2022/0376047 A1 | 11/2022 | Mears et al. |
| 2022/0384579 A1 | 12/2022 | Hytha et al. |
| 2022/0384600 A1 | 12/2022 | Mears et al. |
| 2022/0384612 A1 | 12/2022 | Hytha et al. |
| 2023/0121774 A1 | 4/2023 | Weeks et al. |
| 2023/0122723 A1 | 4/2023 | Weeks et al. |
| 2023/0136797 A1 | 5/2023 | Hytha et al. |

OTHER PUBLICATIONS

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/ http://www3.interscience.wiley.com/cgi-bin/abstract/72512946/ start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/# EE Times; retreived from internet Feb. 10, 2022; pp. 3.

* cited by examiner

2900

Vddp – 1.8V

Vdd2 – 0.4V – 0.6V

0V – Gnd

DRAM SENSE AMPLIFIER ARCHITECTURE WITH REDUCED POWER CONSUMPTION AND RELATED METHODS

TECHNICAL FIELD

The present disclosure generally relates to semiconductor devices and, more particularly, to semiconductor memory devices and related methods.

BACKGROUND

One important requirement for DRAM (Dynamic Random Access Memory) devices is the ability to hold data in an inactive state with the minimum power drain. This power drain comes from the need to refresh the data stored in bit cells in selected portions of the memory, as well as leakage in the rest of the periphery. This specification is referred to as IDD6. This directly affects the usable time from a battery charge for smart phones, laptops, etc. Another important parameter for DRAM devices is latency. Latency is the delay between selecting a random location within the memory device and the arrival of the selected data on the outputs.

One particularly advantageous memory device is set forth in U.S. Pat. No. 7,659,539 to Kreps et al., which is assigned to the present Assignee and hereby incorporated herein in its entirety by reference. This patent discloses a semiconductor device which includes a semiconductor substrate and at least one non-volatile memory cell. The at least one memory cell may include spaced apart source and drain regions, and a superlattice channel including a plurality of stacked groups of layers on the semiconductor substrate between the source and drain regions. Each group of layers of the superlattice channel may include a plurality of stacked base semiconductor monolayers defining a base semiconductor portion and an energy band-modifying layer thereon, which may include at least one non-semiconductor monolayer constrained within a crystal lattice of adjacent base semiconductor portions. A floating gate may be adjacent the superlattice channel, and a control gate may be adjacent the second gate insulating layer.

An advantageous DRAM architecture is disclosed in U.S. Pat. No. 10,109,342 to Roy. This includes a plurality of memory cells, and at least one peripheral circuit coupled to the plurality of memory cells and comprising a superlattice. The superlattice includes a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions. The semiconductor device further includes a first power switching device configured to couple the at least one peripheral circuit to a first voltage supply during a first operating mode, and a second power switching device configured to couple the at least one peripheral circuit to a second voltage supply lower than the first voltage supply during a second operating mode.

Despite the advantages of such devices, further developments in memory technology may be desired in certain applications.

SUMMARY

A dynamic random access memory (DRAM) device may include an array of DRAM cells, with each DRAM cell configured to store a high logic voltage and a low logic voltage. The DRAM device may further include a precharge circuit configured to selectively provide a first reference voltage and a second reference voltage to a first line and a second line, respectively, and a sense amplifier including a cross-coupled transistor sensing circuit coupled between the first line and second line. The sense amplifier may include at least one transistor including spaced apart source and drain regions, a superlattice channel extending between the source and drain regions, and a gate overlying the superlattice channel. The superlattice channel may include a plurality of stacked groups of layers, with group of layers including a plurality of stacked base semiconductor monolayers defining a base semiconductor portion, and at least one non-semiconductor monolayer constrained within a crystal lattice of adjacent base semiconductor portions. The DRAM device may further include a refresh circuit configured to selectively couple a third reference voltage to a corresponding DRAM cell via the first line and based upon a voltage difference between the first line and the second line, with the third reference voltage being greater than the high logic voltage of the DRAM cell.

In an example embodiment, the at least one transistor of the cross-coupled transistor sensing circuit may comprise all of the transistors of the cross-coupled transistor sensing circuit. In another example implementation, the refresh circuit may include at least one transistor including spaced apart source and drain regions, a superlattice channel (such as the one discussed briefly above) extending between the source and drain regions, and a gate overlying the superlattice channel.

In one example embodiment, the precharge circuit may include at least one transistor comprising spaced apart source and drain regions, a superlattice channel (such as the one discussed briefly above) extending between the source and drain regions, and a gate overlying the superlattice channel. The DRAM device may also include a programming circuit cooperating with the refresh circuit to selectively couple the third reference voltage to the corresponding DRAM cell. In an example implementation, the programming circuit may include at least one transistor including spaced apart source and drain regions, a superlattice channel (such as the one discussed briefly above) extending between the source and drain regions, and a gate overlying the superlattice channel.

In accordance with an example implementation, the DRAM device may include another refresh circuit configured to selectively couple a fourth reference voltage via the second line to another corresponding DRAM cell based upon a voltage difference between the first line and the second line. In some embodiments, the DRAM memory device may be configured in a plurality of stacked DRAM integrated circuits (IC) including the above-describe components.

A related method for making a DRAM device may include forming an array of DRAM cells, each DRAM cell having a high logic voltage and a low logic voltage, forming a precharge circuit configured to selectively provide a first reference voltage and a second reference voltage to a first line and a second line, respectively, and forming a sense amplifier comprising a cross-coupled transistor sensing circuit coupled between the first line and second line. The sense amplifier may include at least one transistor including spaced apart source and drain regions, a superlattice channel (such as the one described briefly above) extending between the source and drain regions, and a gate overlying the superlattice channel. The method may further include forming a refresh circuit configured to selectively couple a third reference voltage to a corresponding DRAM cell via the first line and based upon a voltage difference between the first line and the second line, the third reference voltage being greater than the high logic voltage of the DRAM cell.

DETAILED DESCRIPTION

Figure 1:
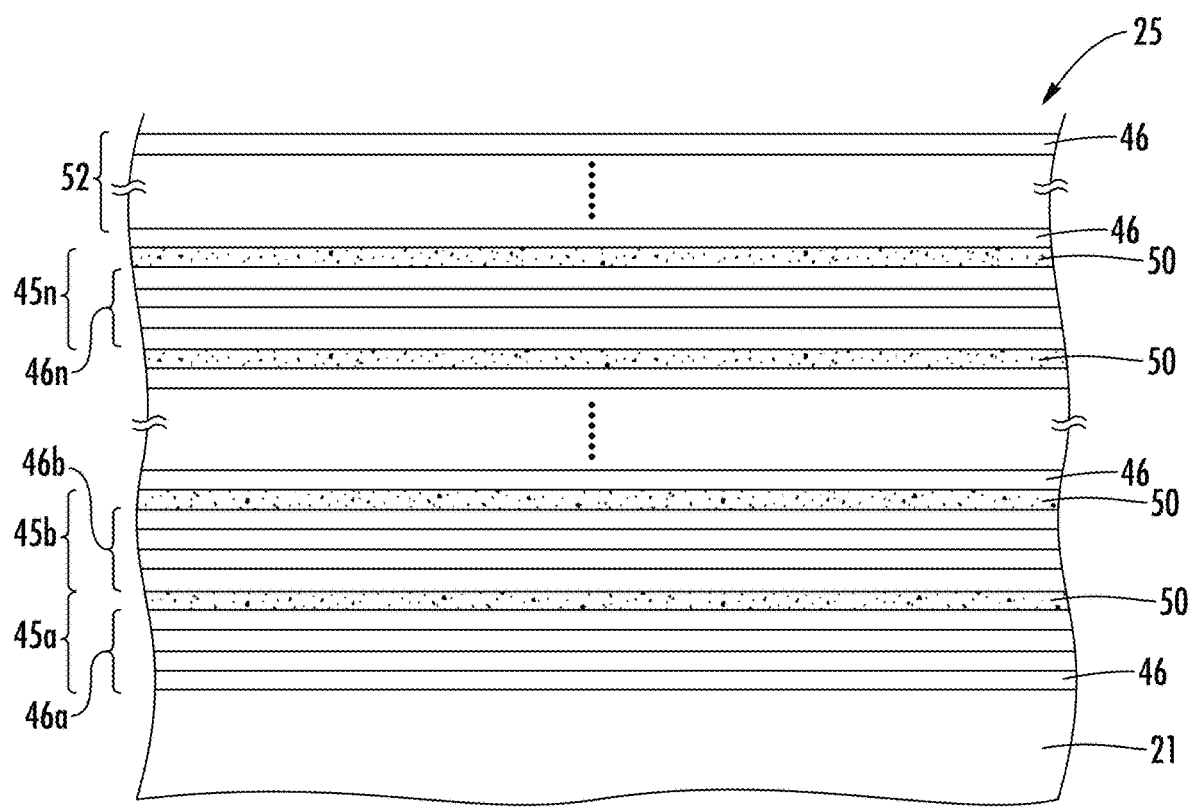
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F}\int_{B.Z.}(\nabla_k E(k,n))_i(\nabla_k E(k,n))_j \frac{\partial f(E(k,n),E_F,T)}{\partial E}d^3k}{\sum_{E>E_F}\int_{B.Z.}f(E(k,n),E_F,T)d^3k}$$

for electrons and:

$$M_{h,ij}^{-1}(E_F, T) = \frac{-\sum_{E<E_F}\int_{B.Z.}(\nabla_k E(k,n))_i(\nabla_k E(k,n))_j \frac{\partial f(E(k,n),E_F,T)}{\partial E}d^3k}{\sum_{E<E_F}\int_{B.Z.}(1-f(E(k,n),E_F,T))d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
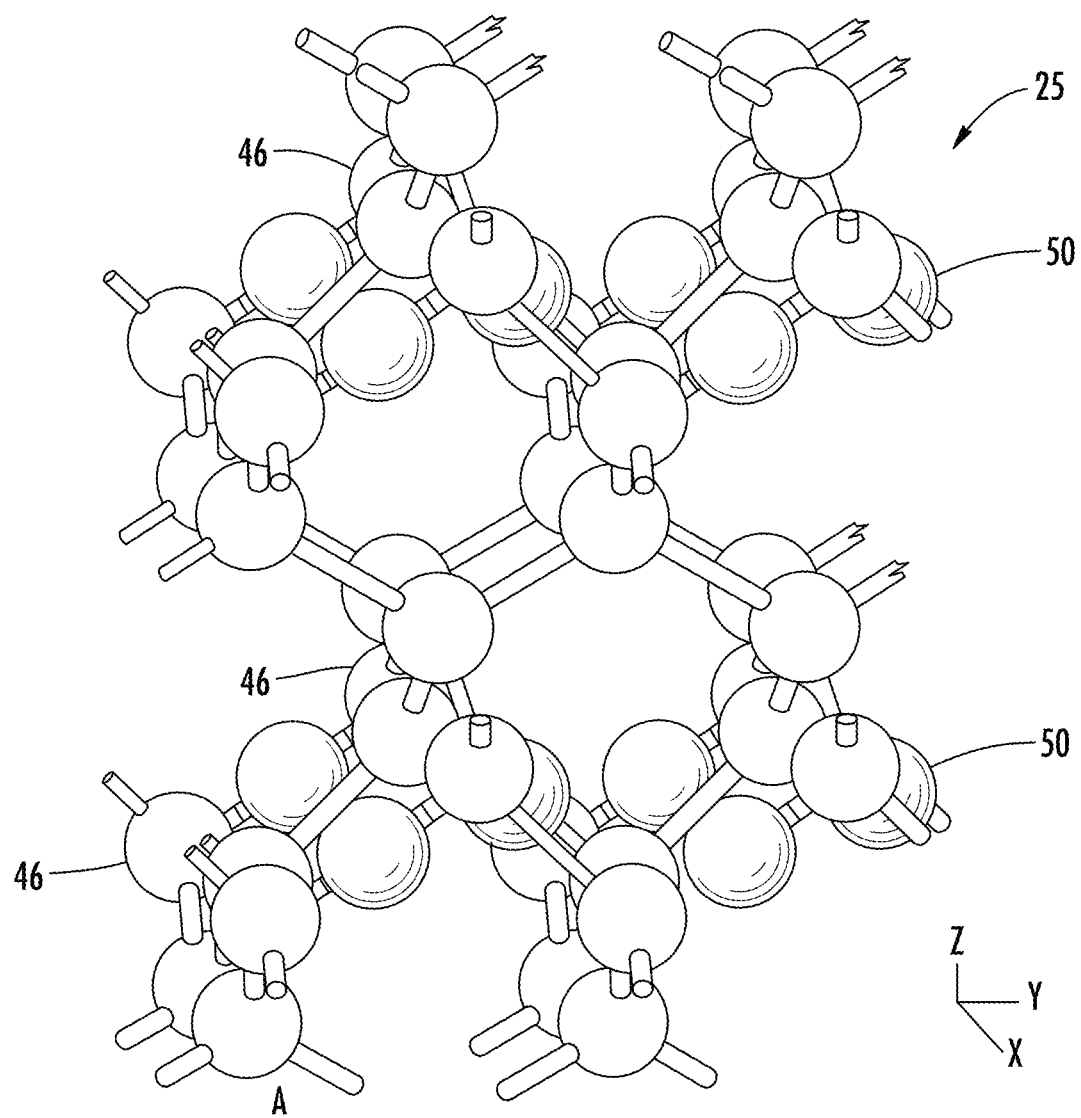
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
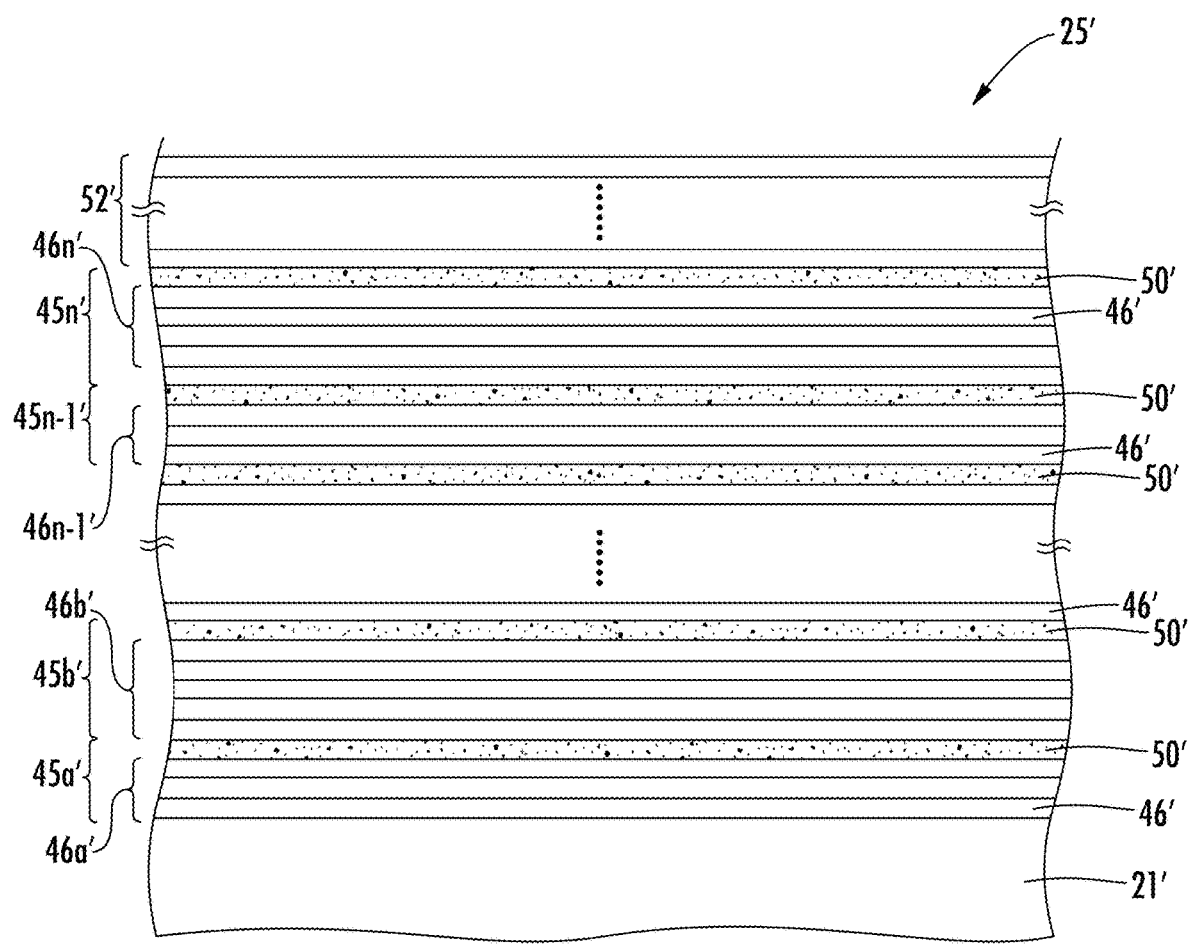
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
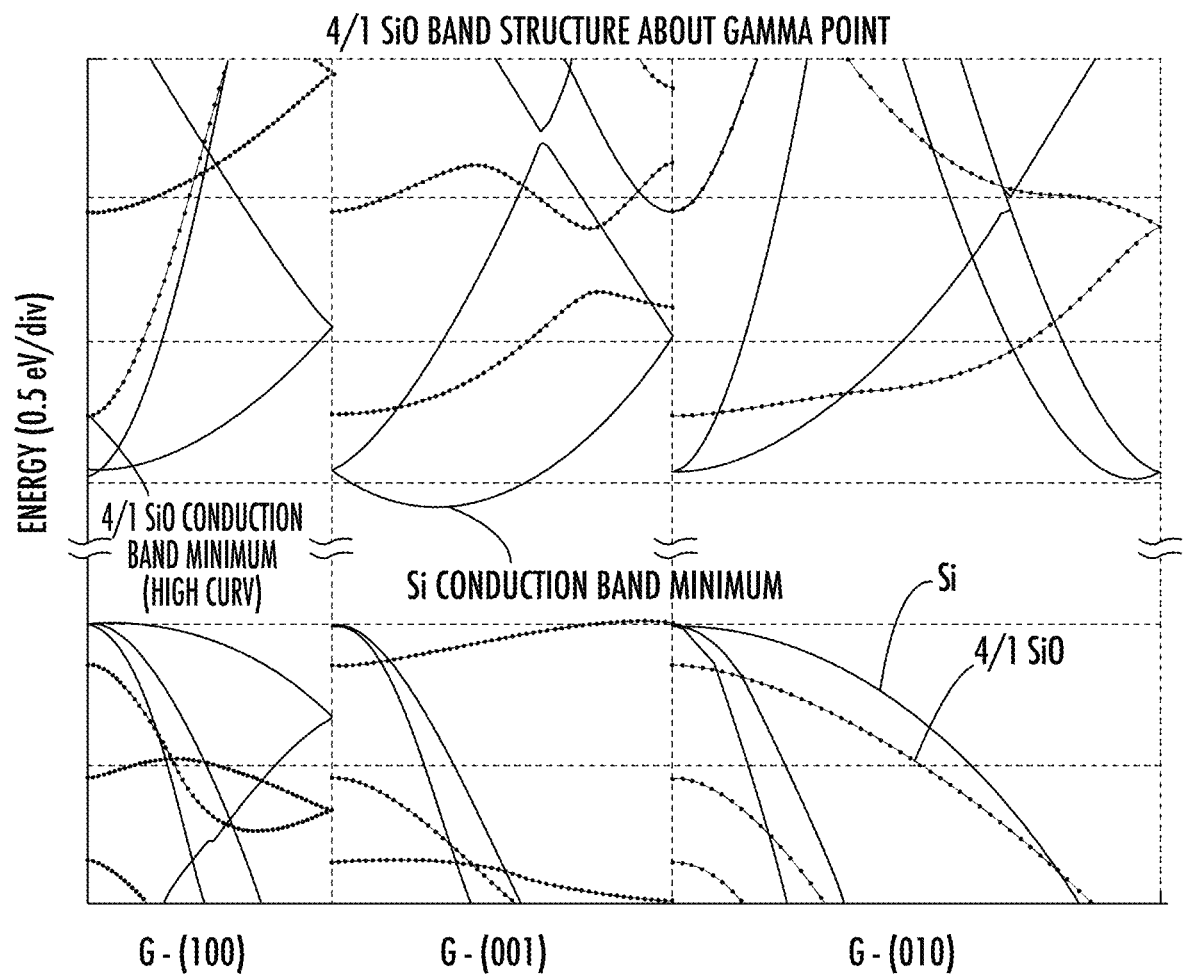
FIG. 4A is a graph of the calculated band structure from the gamma point (G) for both bulk silicon as in the prior art, and for the 4/1 Si/O superlattice as shown in FIGS. 1-2.
Figure 4B:
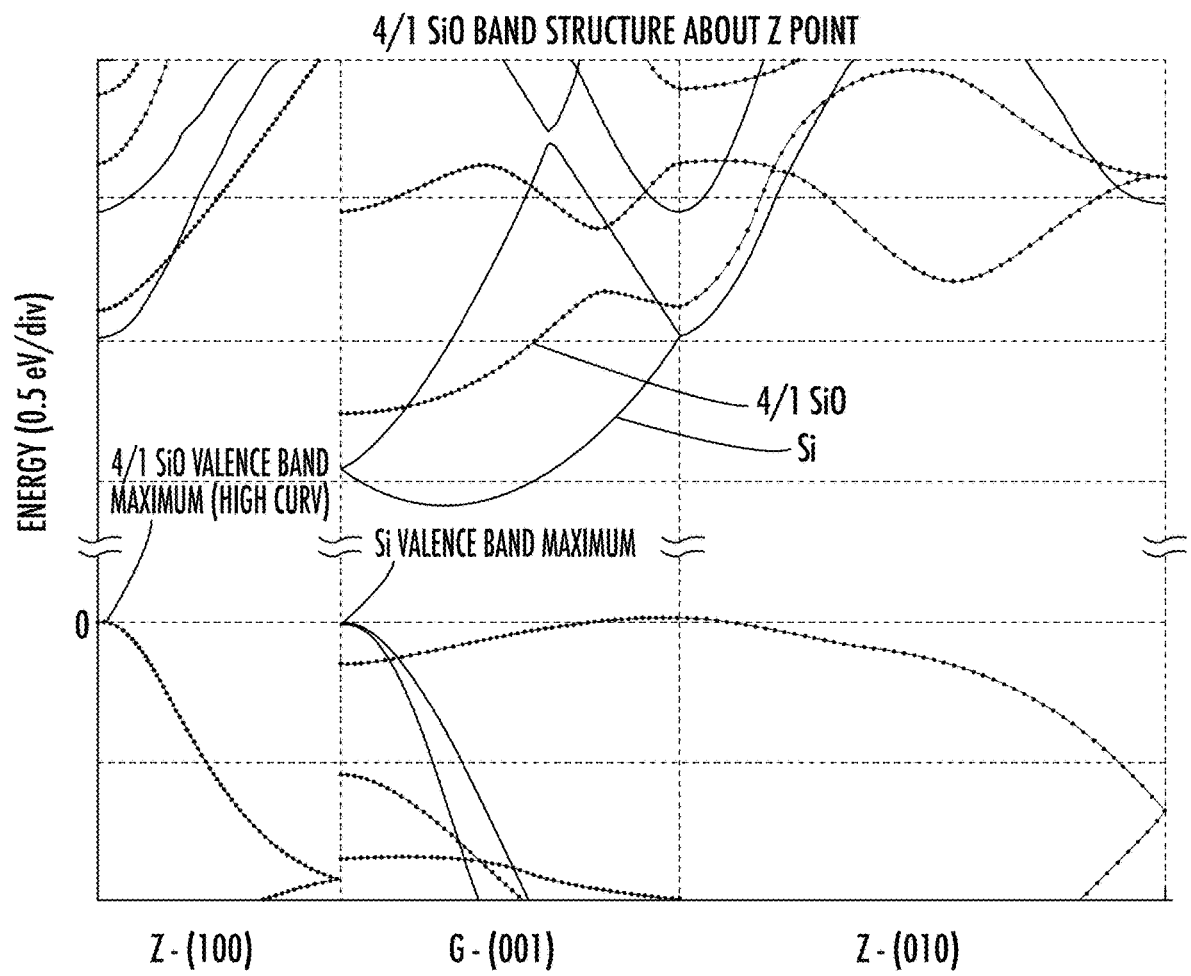
FIG. 4B is a graph of the calculated band structure from the Z point for both bulk silicon as in the prior art, and for the 4/1 Si/O superlattice as shown in FIGS. 1-2.
Figure 4C:
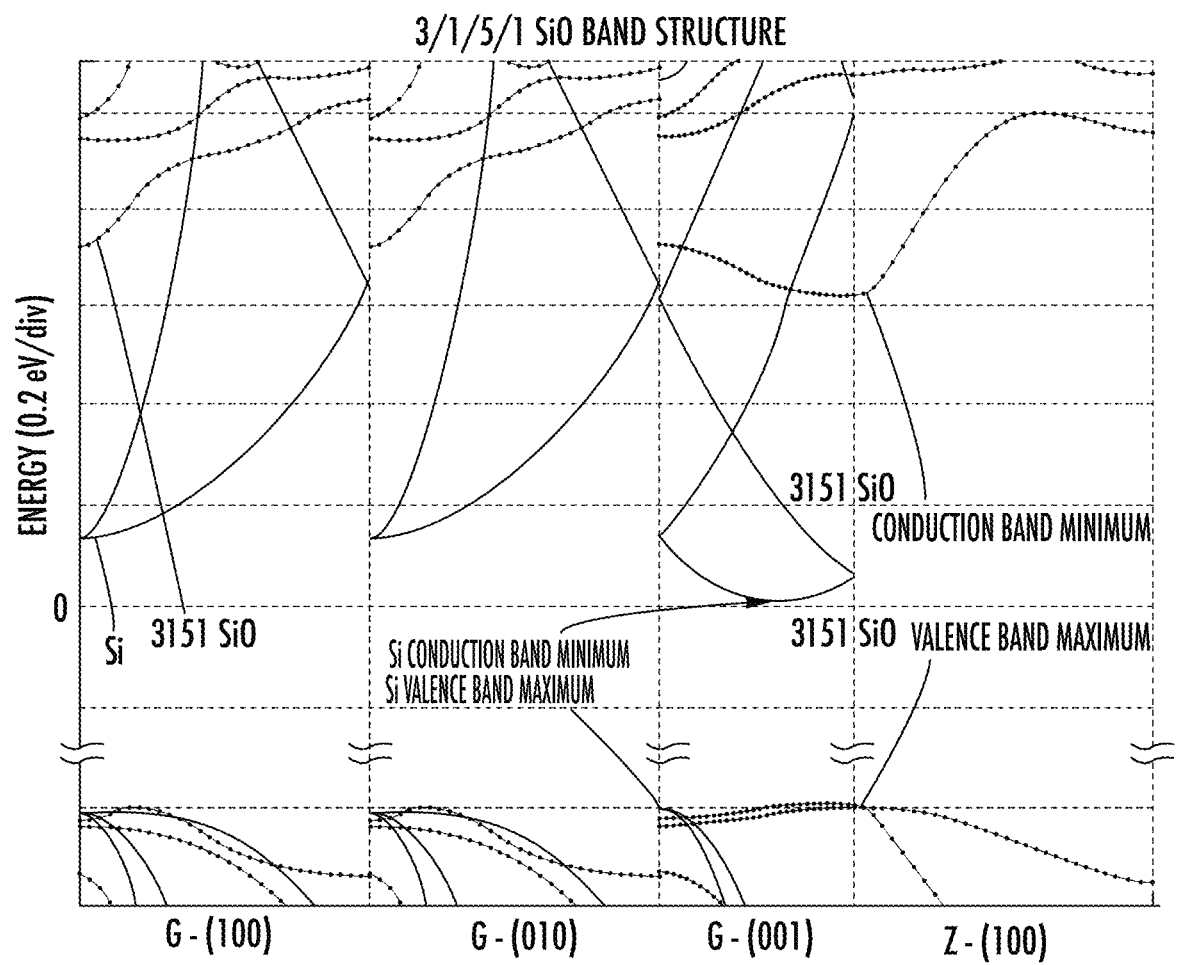
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

MST technology for CMOS devices as described above has the capability to operate with significant overdrive voltage compared to standard CMOS devices. As a result, the performance of MST-based devices is up to 70% higher than standard CMOS technology, which can translate into a corresponding reduction in latency. An example approach for integrating MST technology in CMOS devices is set forth in U.S. Pat. No. 6,878,576 to Mears et al., which is hereby incorporated herein in its entirety by reference.

During IDD6 standby where the data in the array is continually refreshed, it is not necessary to operate at the same speed as during the faster active mode made possible by the use of MST technology. The specification for the time a bit cell can reliably store the data (hereinafter referred to as the Refresh Interval) is long enough for the entire array to be fully refreshed at the current performance levels of the Row Activation circuitry. As a result, this creates an opportunity to operate the Row activation path of the circuit at a significantly lower voltage, while maintaining the clock rate at current levels (as opposed to the faster levels made possible by overdriven MST technology). By reducing the VDD applied to these circuits from 1.0V to 0.7V, for example, the array can be fully refreshed at current speeds, thus allowing this portion of the standby power to be reduced by approximately 50%, as will be discussed further below. The present invention describes a modification to the typical DRAM architecture that allows such a power reduction during IDD6 standby mode.

A further characteristic of MST technology is that high Vt and low Vt devices may each be optimized separately on the same chip. By optimizing the high Vt devices for minimal leakage, they may be used as headers for reducing leakage in the rest of the periphery during standby mode, while allowing optimization of the low Vt devices in these paths to be even faster than the 70% improvement referred to above during active mode. Further details regarding DRAM memory that incorporate MST films to achieve these technical advantages are provided in the above-noted U.S. Pat. No. 10,109,342, as well as in U.S. Pat. No. 10,107,854 also to Roy, which are hereby incorporated herein in their entireties by reference.

Figure 5:
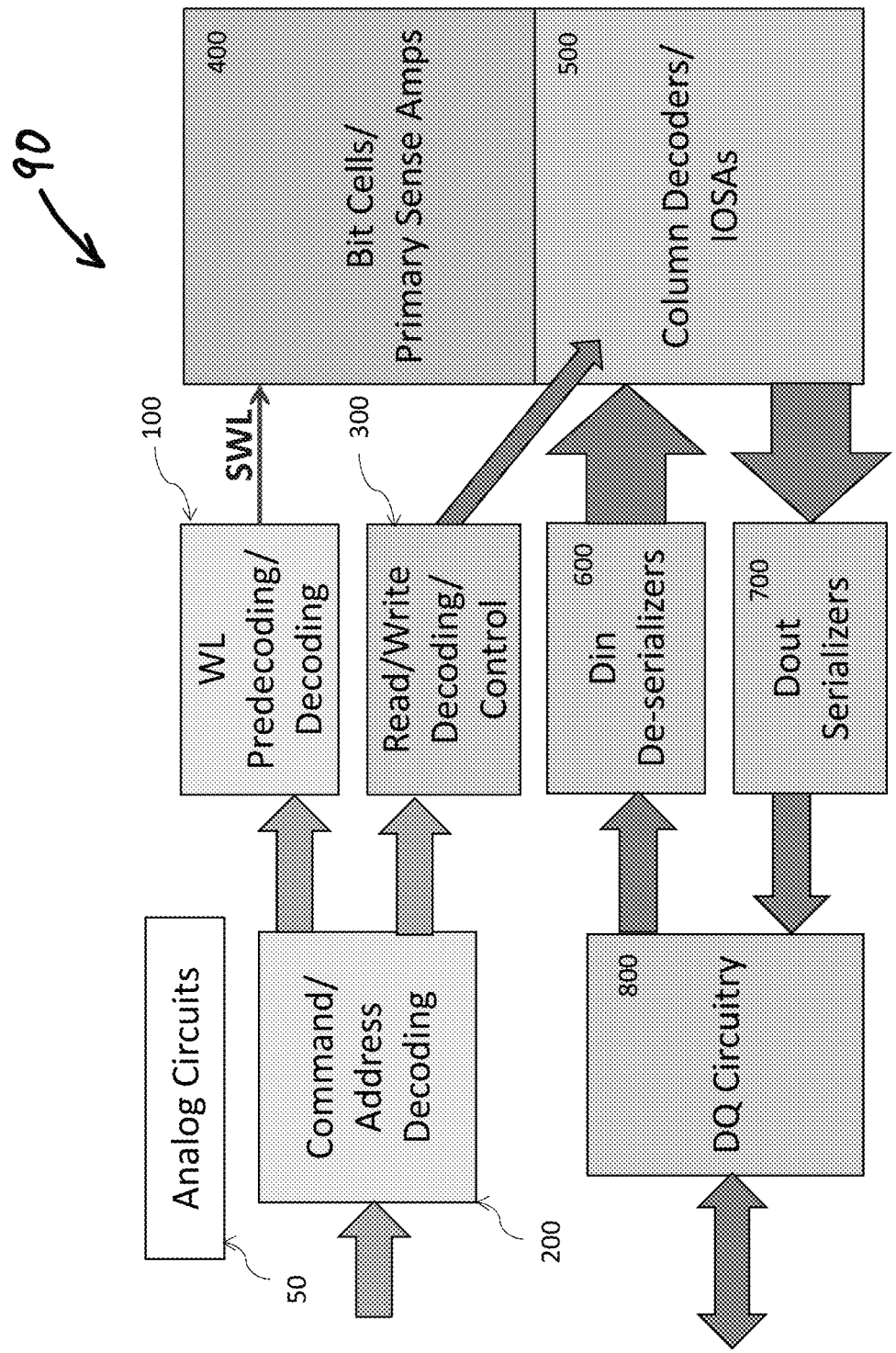
FIG. 5 is a schematic block diagram of a typical DRAM architecture in accordance with the prior art.

Turning now to FIG. 5, a typical DRAM architecture 90 is first described by way of background. Inputs come into the chip on the left side, into block 200. This represents the logic for decoding address information for the selected cells as well as control information to determine the type of operation to be performed. Part of this information is fed into the Word Line Pre-decoding and decoding circuitry, otherwise known as Row Activation circuitry, represented by block 100. The other part of this information is fed into block 300, which is Read/Write Decoding and Control. The terms Read and Write refer to column operations only to previously Activated Rows. This circuitry is not operated during refresh-only operations, where the data is not read to or written from the outside world. During Read and Write operations, the outputs of this circuitry are fed into block 500, which includes Column Decoders and Secondary Sense Amps (IOSAs) which interface directly to the memory array 400, which includes all Bit Cells and Primary Sense Amps. Block 100, which includes Word Line Pre-decoding and Decoding circuitry, also interfaces directly to the bit cells in the memory array 400. Block 500 also interfaces directly with blocks 600 and 700, the data in and data out paths. Frequently the internal bus width of the DRAM is much wider than the external interfaces, so the data in and data out paths include serialization (for data out) and de-serialization (for data in). Finally, the data in and data out paths are combined at block 800, which is the bidirectional DQ circuitry that interfaces with the outside world.

Figure 6:
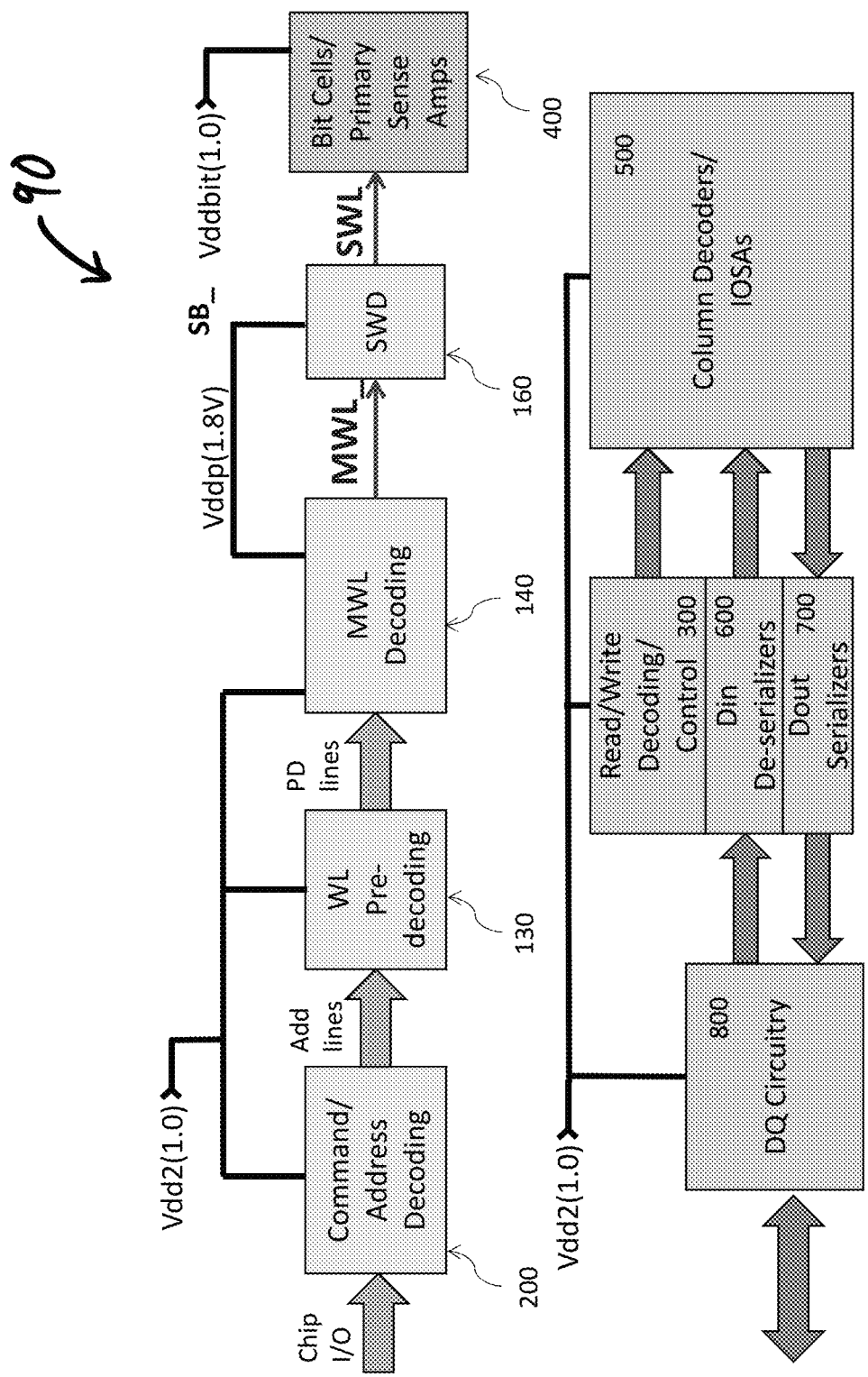
FIG. 6 is a schematic block diagram of the DRAM architecture of FIG. 5 showing the WL pre-decoding/decoding components in greater detail.

Turning now to FIG. 6, the example prior art DRAM architecture 90 with typical supply voltages is shown. Here, the Row Activation (Word Line Pre-decoding and Decoding circuitry) block 100 of FIG. 5 has been subdivided into block 130 (WL Pre-decoding), block 140 (MWL Decoding) and block 160 (SWD, or Sub Word Drivers). Block 160 drives the actual Word lines that connect to the bit cells in block 400 (Bit Cells and Primary Sense Amps). The bit cells and primary sense amps (block 400) are driven by Vddbit, which is usually in the range of 0.9V to 1.0V for both active and standby modes. Likewise, the MWD (Main Wordline Decoder, block 140), and SWD (Sub Word Driver, block 160) are powered by Vddp (approximately 1.8V).

Figure 7:
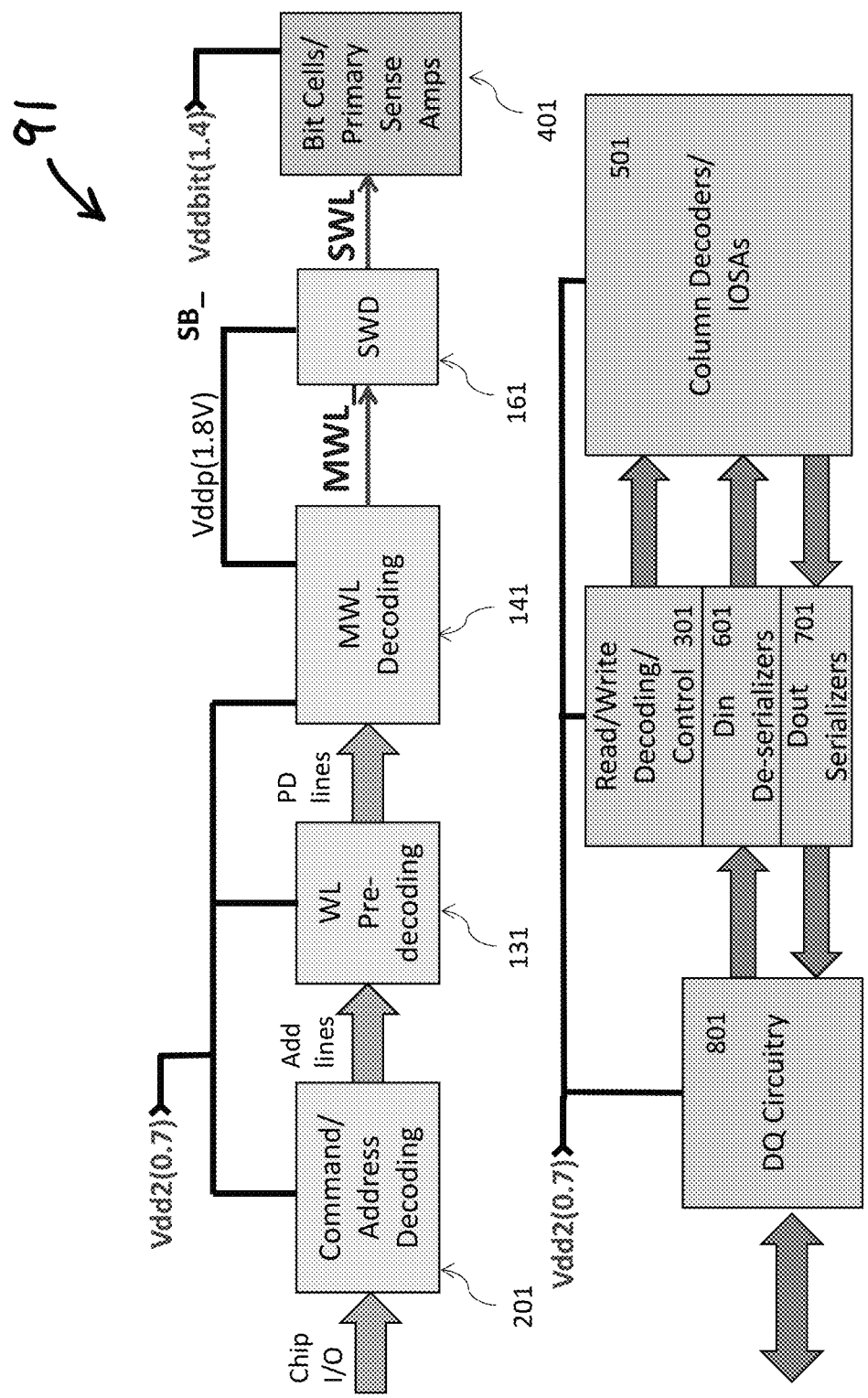
FIG. 7 is a schematic block diagram of an example DRAM architecture in accordance with an example embodiment.

An example DRAM architecture 91 and associated supply voltages in accordance with an example embodiment are shown in FIG. 7. As an initial matter, while the functional blocks described above remain generally the same, lower values of Vdd2 may be used with the inclusion of MST to provide significant power savings. Accordingly, the block numbers are incremented by one compared to FIG. 6. In the example implementation, a Vdd2 of 0.7V and Vddbit of 1.4V are used, as will be discussed further below.

Figure 8:
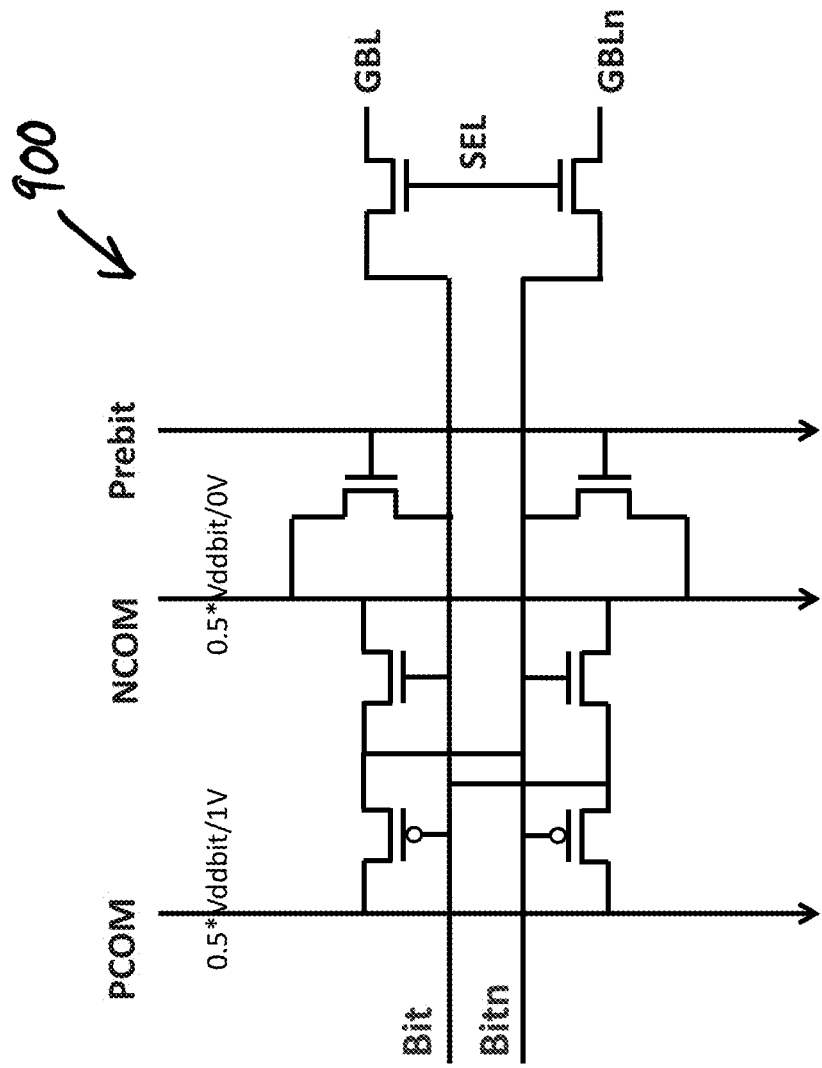
FIG. 8 is a schematic diagram of a minimal sense amp in an idealized case in accordance with the prior art.
Figure 8:
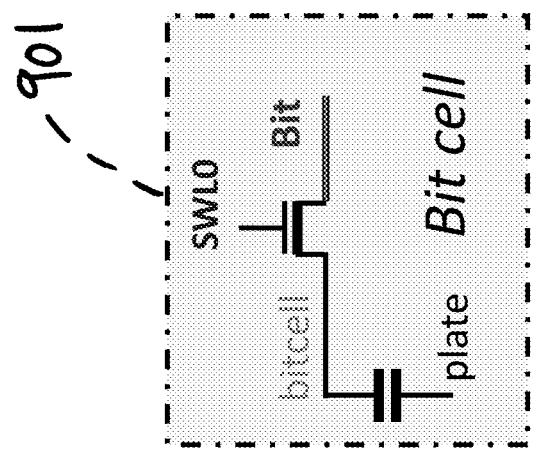
Figure 9:
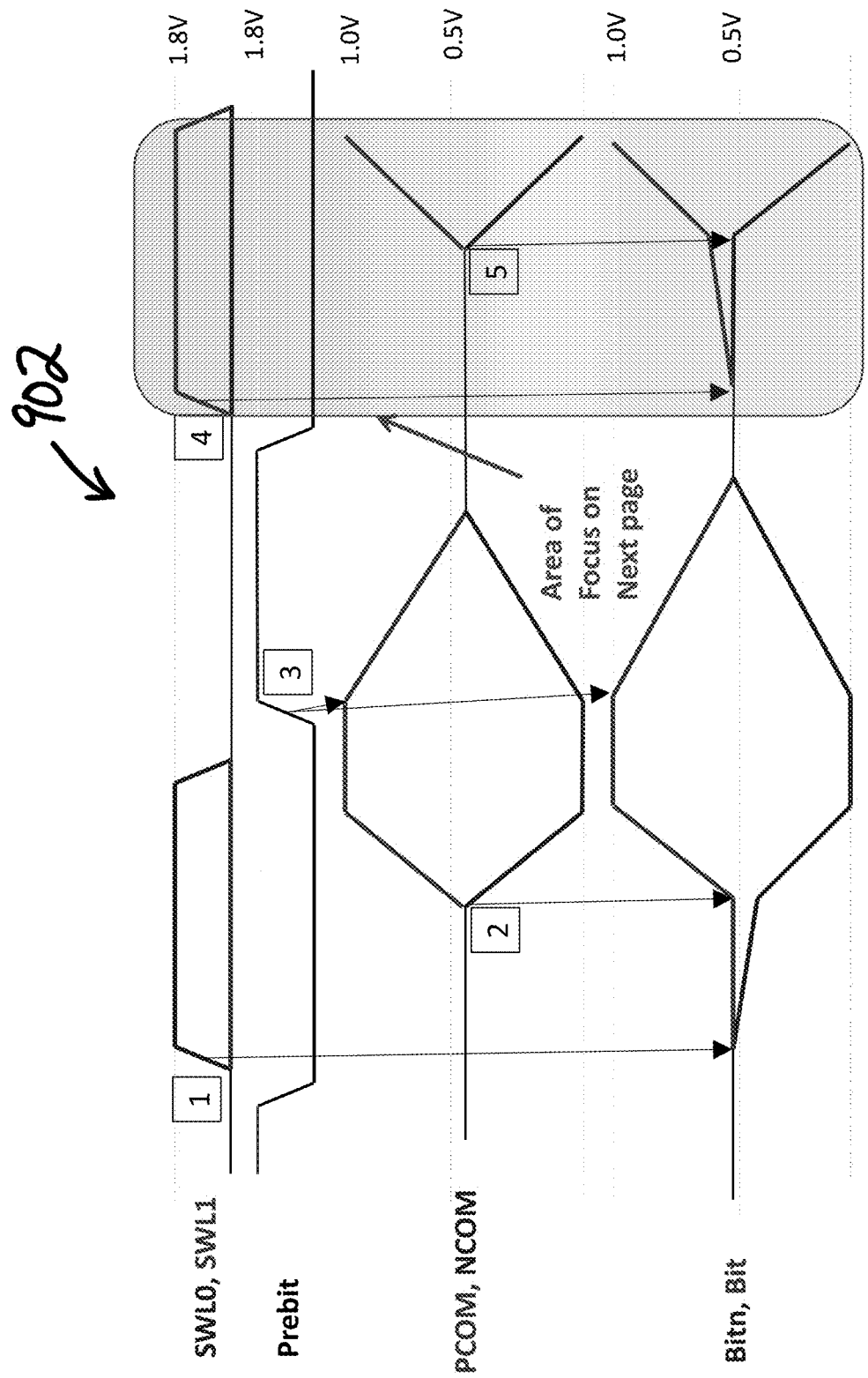
FIGS. 9 and 10 are activate timing diagrams for the sense amp of FIG. 8.
Figure 10:
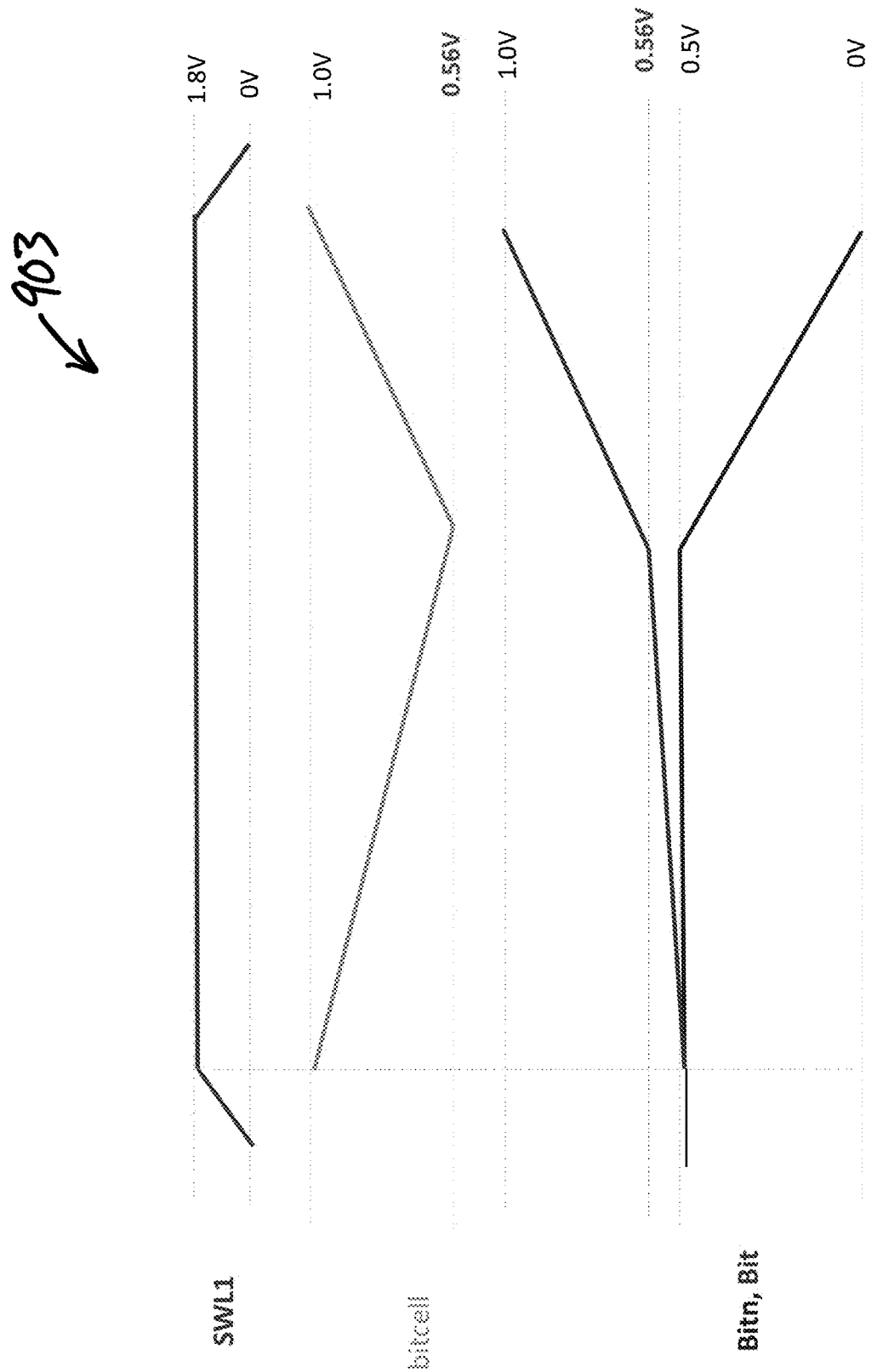

An example minimal sense amp (in an idealized case) 900 and corresponding bit cell 901 in accordance with the prior art are shown in FIG. 8. An associated activate timing diagram 902 for this sense amp is shown in FIG. 9, for the idealized case of a nominal bit cell, balanced sense amp with no leakage. The timing diagram 903 of FIG. 10 expands the region of focus in FIG. 9, and it should be noted that Vddbit is 1V. For a nominal signal at Vddbit of 1V before leakage is taken into account:

$$\Delta V = \frac{(Vcore - V_{BLP})}{1 + C_B/C_S} \quad (1)$$

where Vcore=Vddbit=1V, $V_{BLP}$=0.5V, CB/CS=8, and thus $\Delta V$=56 mV.

Figure 11:
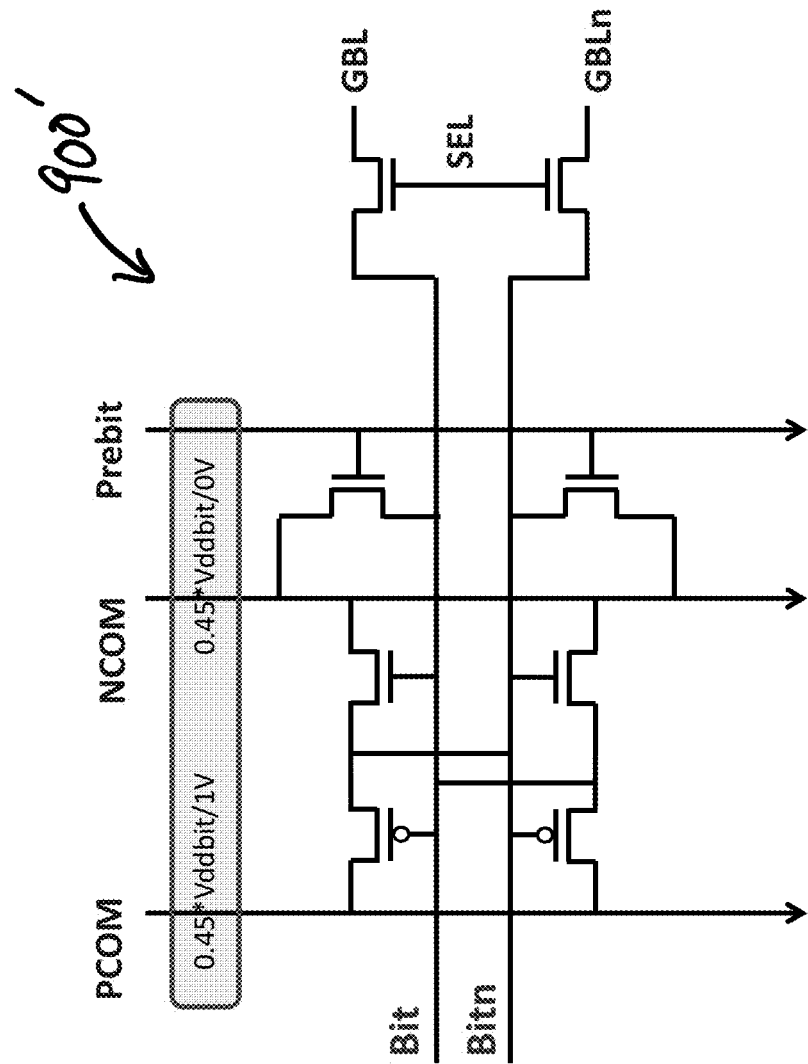
FIG. 11 is a schematic diagram of another minimal sense amp in accordance with the prior art.
Figure 11:
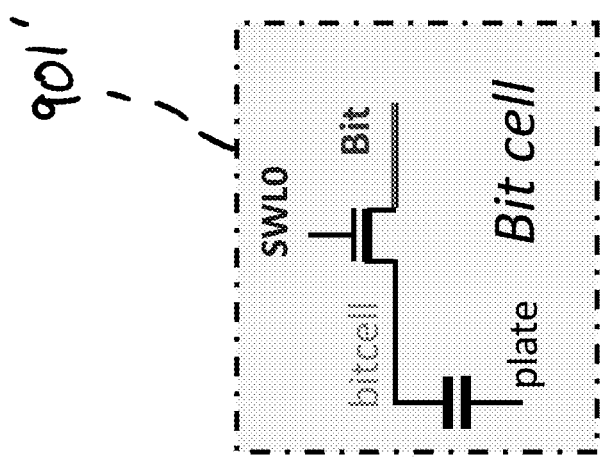
Figure 12:
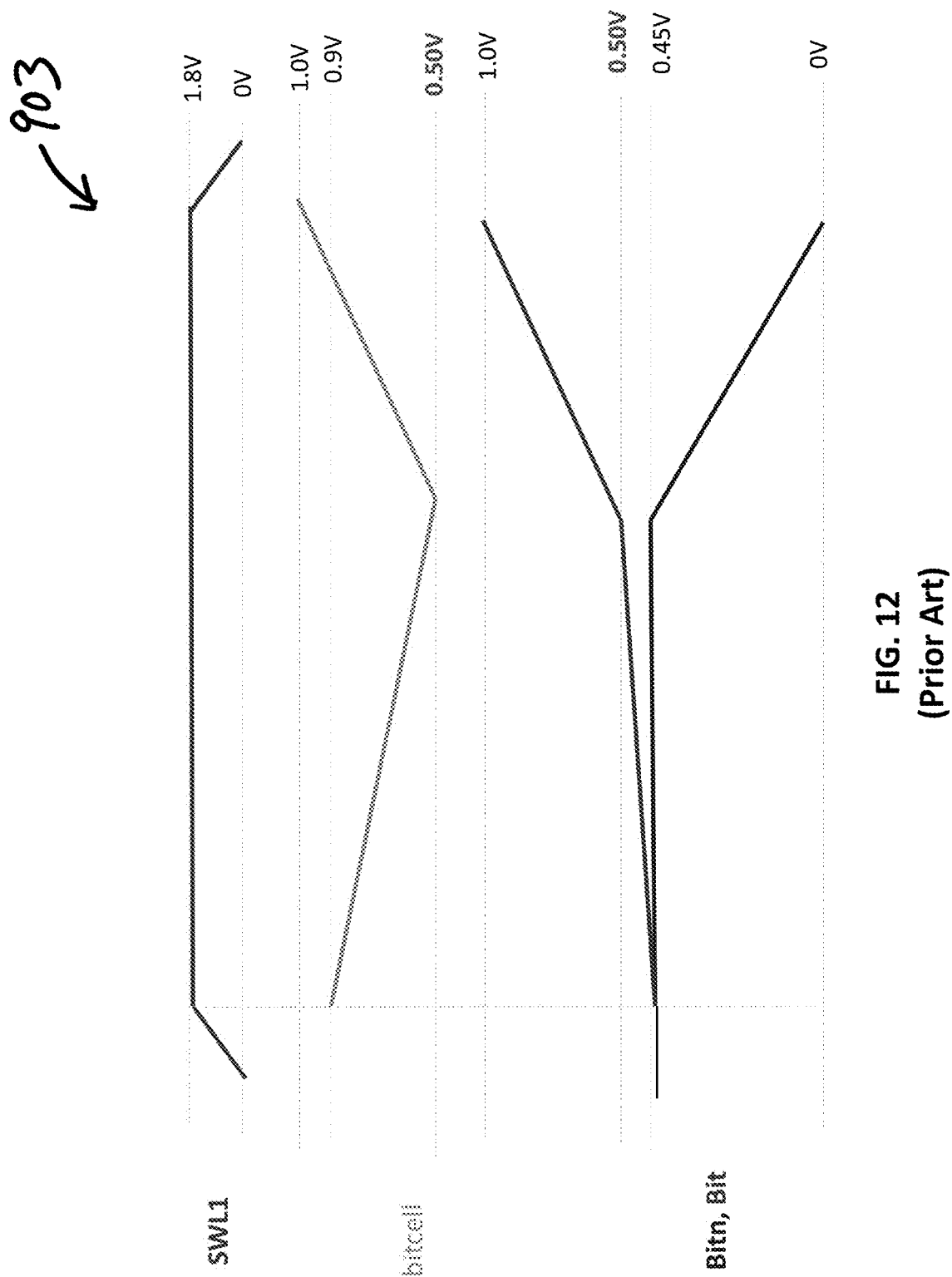
FIG. 12 is an activate timing diagram for the sense amp of FIG. 11.

Turning now to FIG. 11, the sense amp 900' is a modification of the prior art sense amp of FIG. 8 and is shown with a pre-charge lower to compensate for leakage (i.e., non-ideal case) at the end of a refresh interval. The corresponding activate timing diagram 903' (similar to FIG. 10) is shown in FIG. 12. Again using equation (1) above with Vcore=Vddbit=1V and CB/CS=8, $V_{BLP}$ is now 0.45V and Vcore (Vcell) will be 0.9V after a refresh interval, thus giving $\Delta V$=50 mV. The refresh interval is the time it takes for a cell to leak from 1V to 0.9V (100 mV).

Figure 13:
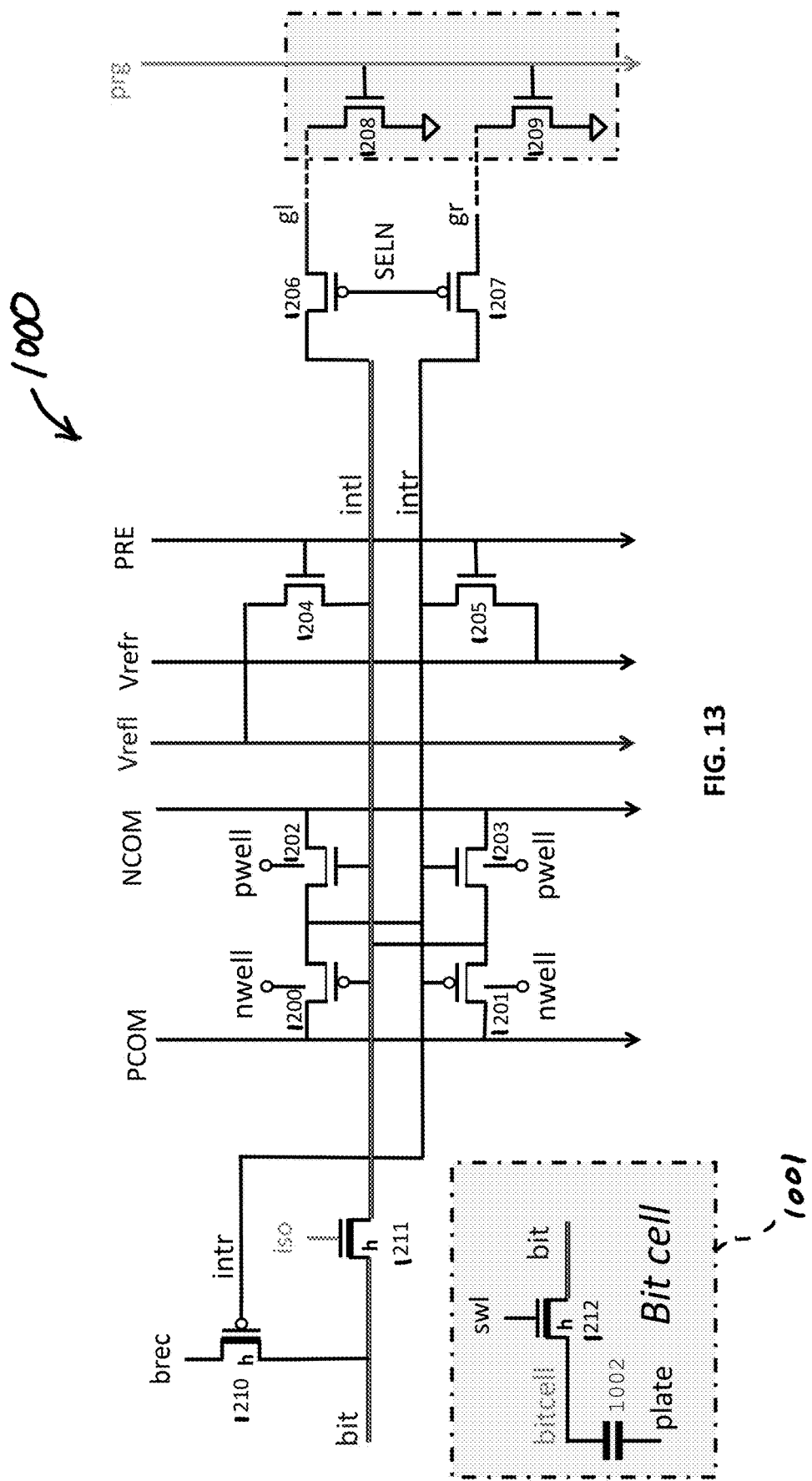
FIG. 13 is a schematic diagram of a single-ended sense amp in accordance with an example embodiment which may be incorporated in the DRAM of FIG. 7.
Figure 14:
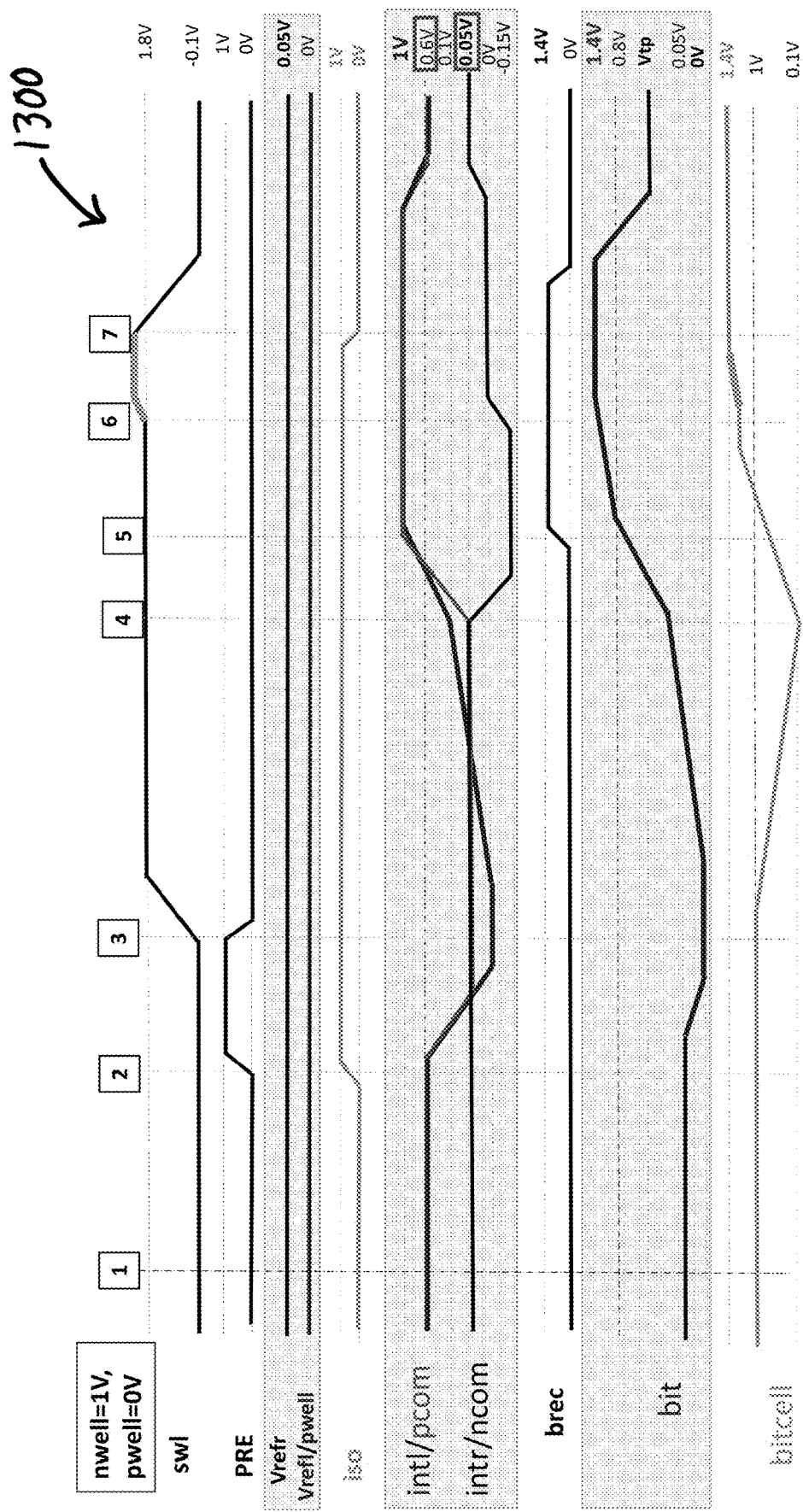
FIG. 14 is a timing diagram for the sense amp of FIG. 13 for an activate read/refresh (stored logic 1) operation.

Turning to FIGS. 13-14, a single-ended sense amp 1000 (and corresponding bit cell 1001) in accordance with an example embodiment and associated timing diagram 1300 for an activate read refresh (stored 1) are now described. The sense amp 1000 includes a bit line sense amplifier including a cross-coupled transistor sensing circuit (transistors 1200-1203); a precharge circuit (transistors 1204-1205); a refresh circuit (transistor 1210); programming circuitry (transistors 1206-1209; and bit line transistor 1211. The bit cell 1001 includes transistor 1212 and capacitor 1002. In the sense amp of FIG. 13, in some embodiments the illustrated transistors include an MST layer defining a channel to provide the above-noted mobility enhancement, although in other embodiments some or all of these transistors need not include an MST layer, as will be discussed further below.

Figure 34:
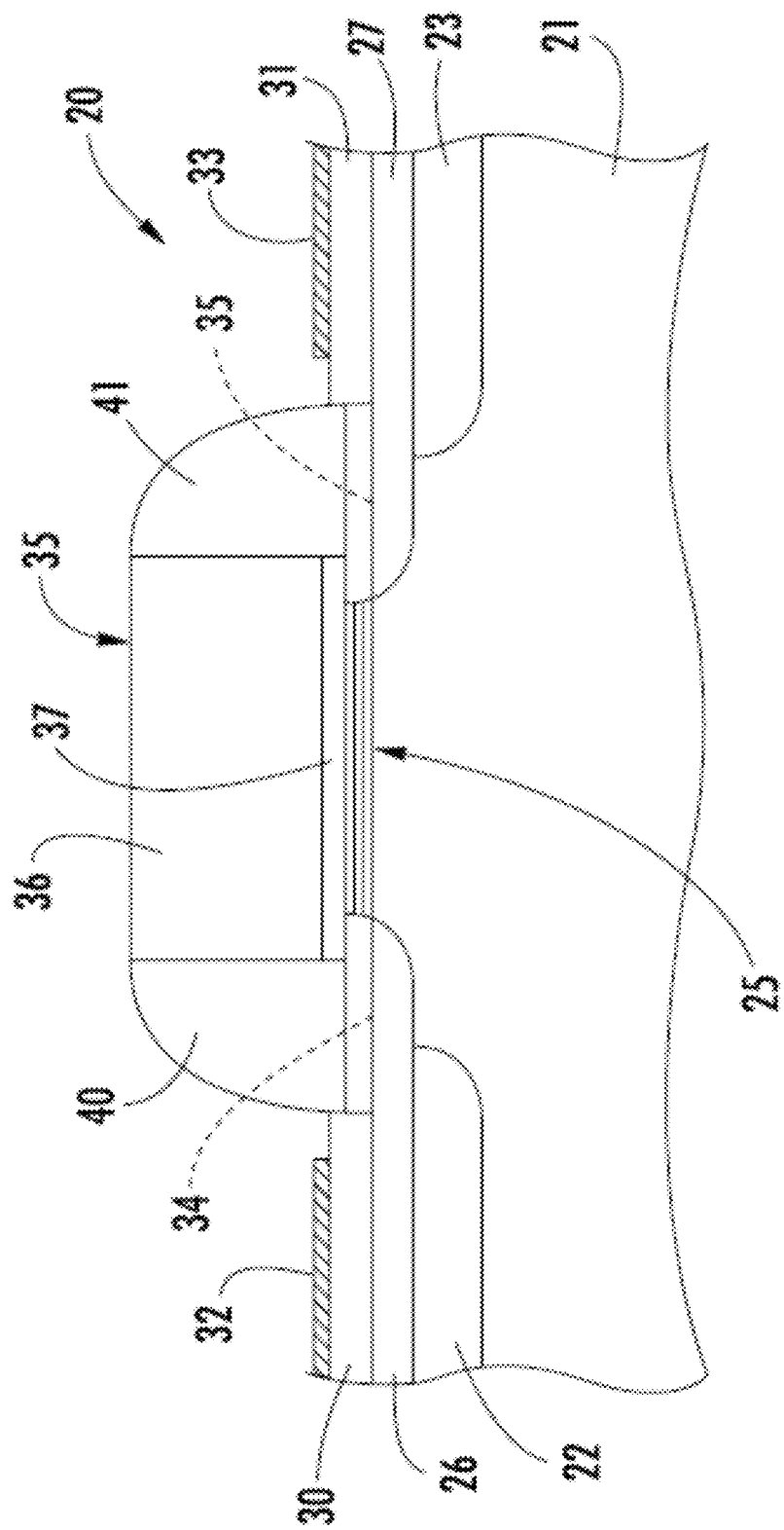
FIG. 34 is a schematic block diagram of an example MOSFET including a superlattice channel which may be used in the above-described DRAM devices.

An example transistor configuration (here a planar MOSFET 20) including a channel defined in an MST layer which may be used for one or more of the above-noted transistors 1200-1212 is now described with reference to FIG. 34. The illustrated MOSFET 20 includes a substrate 21, source/drain regions 22, 23, source/drain extensions 26, 27, and a channel region therebetween provided by the MST superlattice 25. Source/drain silicide layers 30, 31 and source/drain contacts 32, 33 overlie the source/drain regions as will be appreciated by those skilled in the art. Regions indicated by dashed lines 34, 35 are optional vestigial portions formed originally with the superlattice 25, but thereafter heavily doped. In other embodiments, these vestigial superlattice regions 34, 35 may not be present as will also be appreciated by those skilled in the art. A gate 35 illustratively includes a gate insulating layer 37 adjacent the channel provided by the superlattice 25, and a gate electrode layer 36 on the gate insulating layer. Sidewall spacers 40, 41 are also provided in the illustrated MOSFET 20. Further details regarding transistors which may include MST channels are set forth in U.S. Pat. No. 6,897,472 to Mears et al., which is hereby incorporated herein in its entirety by reference.

In the illustrated example of FIG. 14, the timing events for an activate read/refresh are shown for a stored logic 1, where nwell=1V and pwell=0V. At time (1), the rising edge of the external clock to chip (not shown) occurs. This latches in all address and control information for the operation in this clock cycle. Moreover, this decodes the SWL address and determines that it is a Read Activation of a refresh operation, which, in turn, informs the control logic for the other signals that will be sequenced in this cycle.

At time (2), a pre-charge pulse occurs, bit line transistor 1211 is turned on by, and pwell is raised to lower Vt of cross-coupled n-channels for sensing. More particularly, the active side (intl, bit) is pre-charged to Gnd (0V), and the reference side (intr) is pre-charged to reference level Vrefr. Nominally this would be approximately 50 mV. Also, the lower Vtn of the cross-coupled n-channels may allow a longer refresh interval. Furthermore, PCOM may either be pre-charged to Gnd or Vrefr. Pre-charging to Gnd puts less stress on the Vrefr generator, and therefore may be desirable so long as this does not create a problem for sensing starting from an undershoot level. The iso signal may be run from normal Vdd2 (1.1V) since brec pulls bit up to 1.4V for recovering a high level. Vtn may be lowered for sensing due to a relatively small amount of headroom. Generally speaking, a high Vtn is desirable to help reduce leakage power in the sense amp when storing data, i.e., not sensing.

At time (3), pre-charge is shut off and SWL is turned on. Charge sharing occurs to bit and intl between the cell high level at the end of the refresh interval. The final value should have enough margin vs. Vrefr to accurately sense a high level under all PVTs and variation.

At time (4), the sense amp 1000 is latched by pulling PCOM high and NCOM low. PCOM may either be much lower than Vdd2 to save power, or Vdd2 may not have much of an overall power penalty. NCOM should go below ground to provide headroom for sensing with cross-coupled n-channels to the low Vrefr level. This may either be SWL off level (−100 mV), or further negative with a capacitive kick technique.

At time (5), brec is turned on to complete pulling the bit line to the full high level (e.g., 1.4V or so depending on reliability considerations, and higher if possible). With high voltage devices for iso and brec, this allows the sense amp 1000 to operate with higher performance/lower Vt thin oxide devices at levels at or below Vdd2 (1.1V).

At time (6), SWL is capacitively kicked higher to squeeze the full high level into the bit cell. NCOM is also restored to Gnd now that the initial sensing is over. More particularly, NCOM may be pulled back up to zero to make sure Gnd is stored as the low level in the cell to minimize leakage of SWL device, which has Vgs=−100 mV when off. However, this may not be required in all embodiments. The goal is to not leak the bit line when reading a logic 1 on a different SWL on the same physical bit line.

Time (7) marks the end of activity when everything is shut off. This allows cycle time to extend with little or no consequences.

Referring again to equation (1), for Vcore (Vcell, Vbit) =0.9V after refresh interval, VBLP=0V, and CB/CS=8, this gives ΔV=100 mV, which translates to a signal of 50 mV. Here the refresh interval is the time it takes for the cell to leak from 1.4V to 0.9V (500 mV). It will be appreciated that the example embodiment accordingly provides five (5) times the voltage degradation achieved, and therefore an ~5× impact on the refresh interval and an ~5× impact on the overall standby power. Furthermore, this provides a nearly 2× power reduction due to the elimination of reference bit line capacitance, and thus a total reduction of ~10×. Presuming bit cell leakage characteristics flatten out at lower voltages (due to a weaker field across the depletion region), Applicant theorizes without wishing to be bound thereto, that this number may be significantly higher than 10× relative to the prior art sense amp configurations described above pre-charged to near Vddbit/2.

Previously, DRAMs were not allowed to use error correction code (ECC) as part of redundancy, so the refresh interval was determined by the leakage characteristics of the slightly defective outlier cells that could not be repaired. Now that DRAM may use ECC as part of redundancy, the refresh interval is now dominated by the bulk (nominal) cells rather than the outliers, increasing the above-noted benefits even further, since the leakage characteristic is of fully defect-free bit cells.

Figure 15:
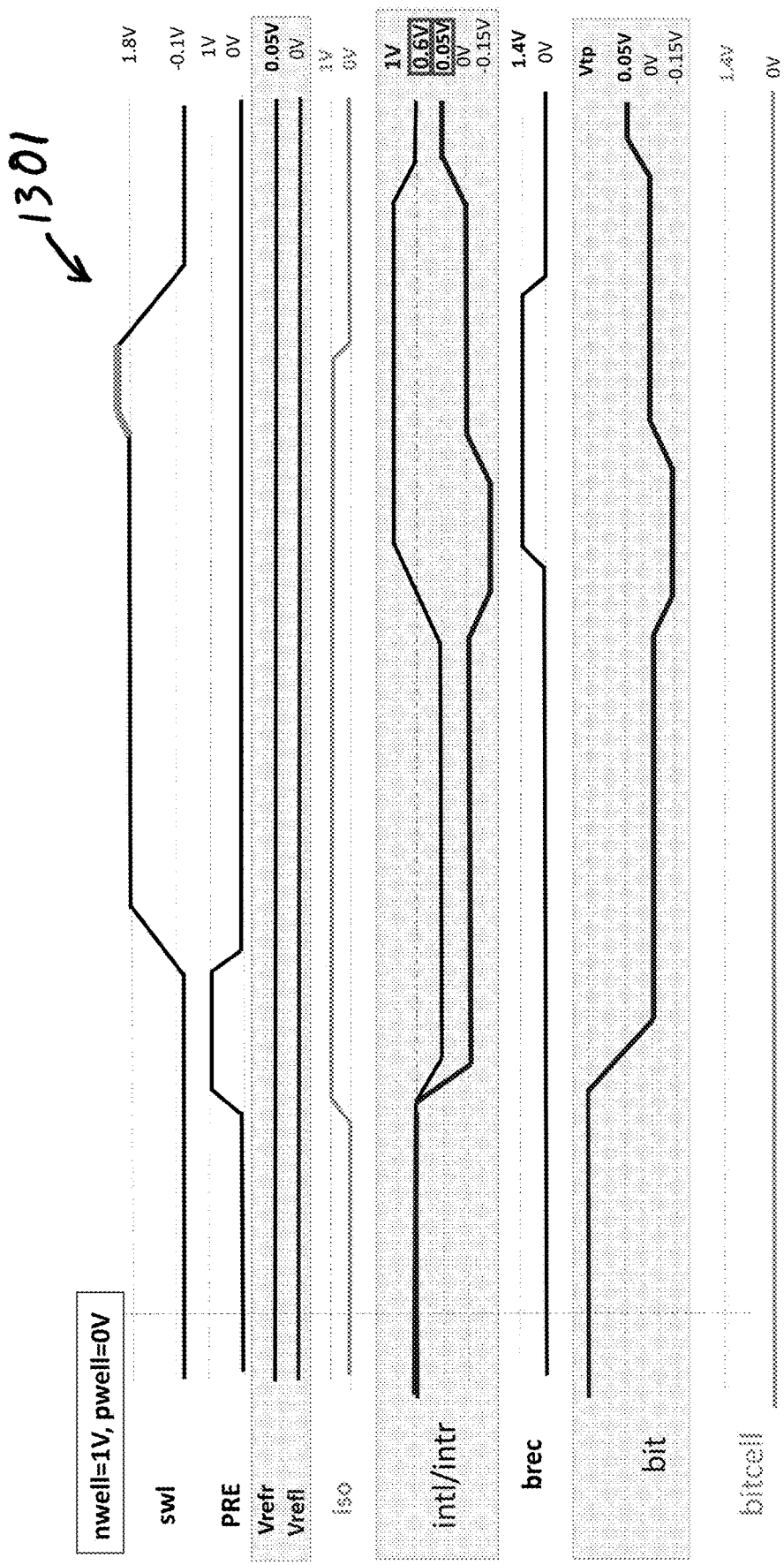
FIG. 15 is a timing diagram for the sense amp of FIG. 13 for an activate read/refresh (stored logic 0) operation.

Referring additionally to FIG. 15, a timing diagram 1301 for the sense amp 1000 of FIG. 13 for activate read/refresh (stored 0) is shown. The goal is to put no read current demands on a stored 0. Generally speaking, Gnd is the most reliable voltage on the chip, if noise sources are handled properly (isolation, mainly). Vrefr is shown in the timing diagrams as nominally 50 mV.

Regarding the stored logic 0 level in the bit cell, going slightly negative would increase the sensing margin for a zero, but the countervailing issue is that no leakage current from multiple stored 0's on a physical bit line are allowed, which could degrade the sensing margin for reading a logic 1 from a different SWL at the end of the refresh interval. The worst case test for this would be reading a logic 1 with stored 0's on all (e.g., 255) of the bit cells on the same physical bit line at high temperature.

Figure 16:
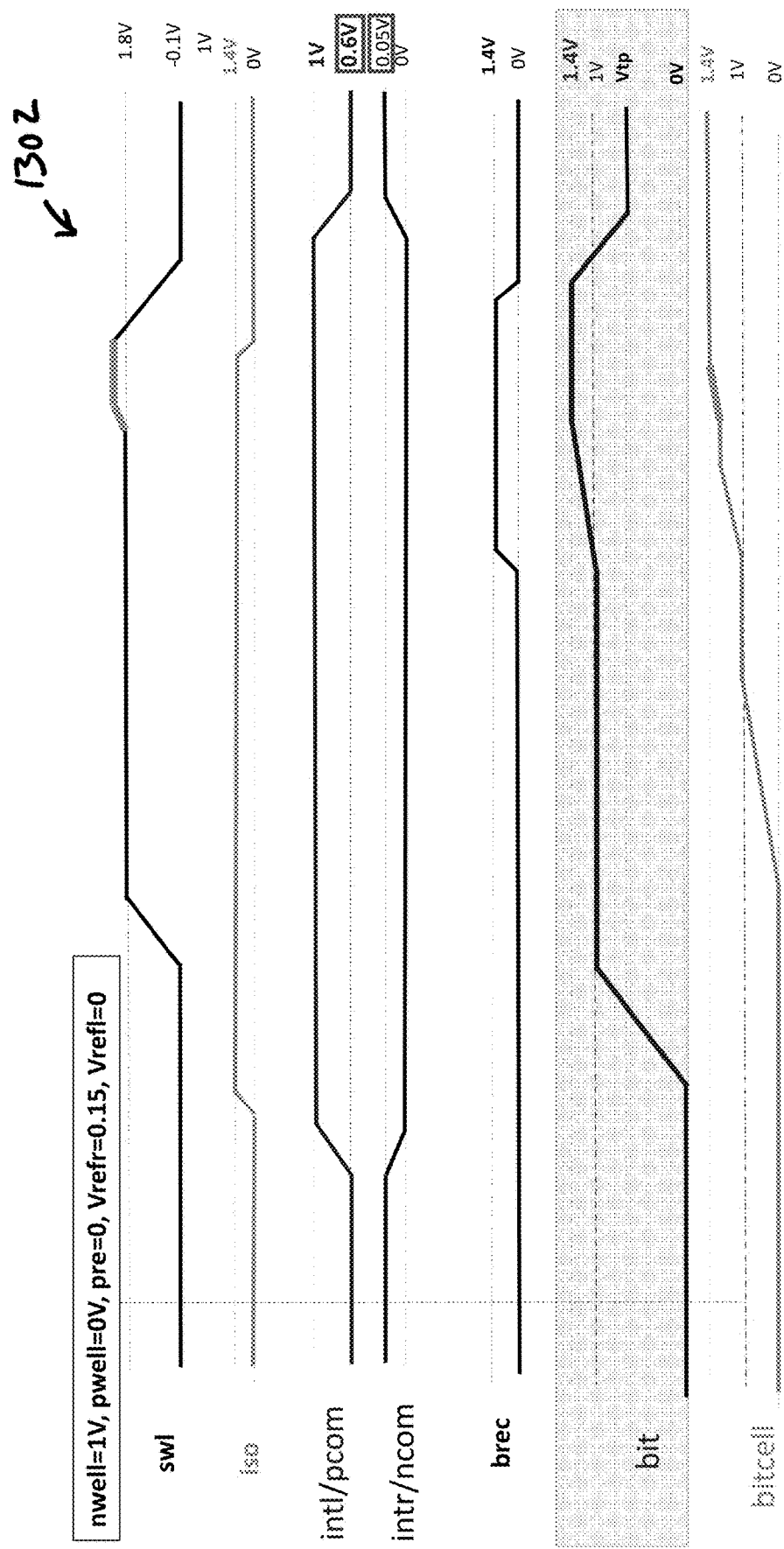
FIG. 16 is a timing diagram for the sense amp of FIG. 13 for an activate write (logic 1) to the bit cell operation.
Figure 17:
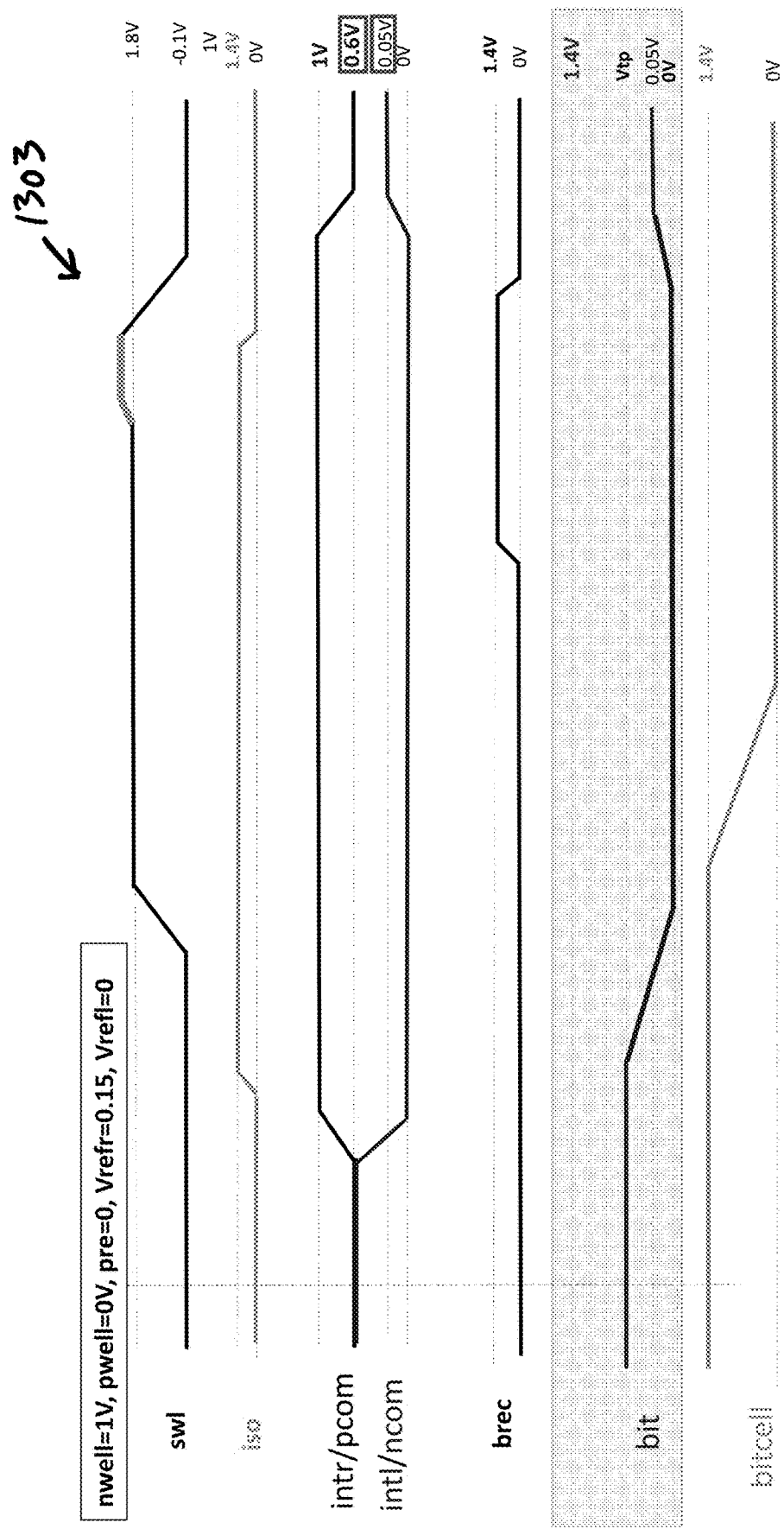
FIG. 17 is a timing diagram for the sense amp of FIG. 13 for an activate write (logic 0) to the bit cell operation.
Figure 18:
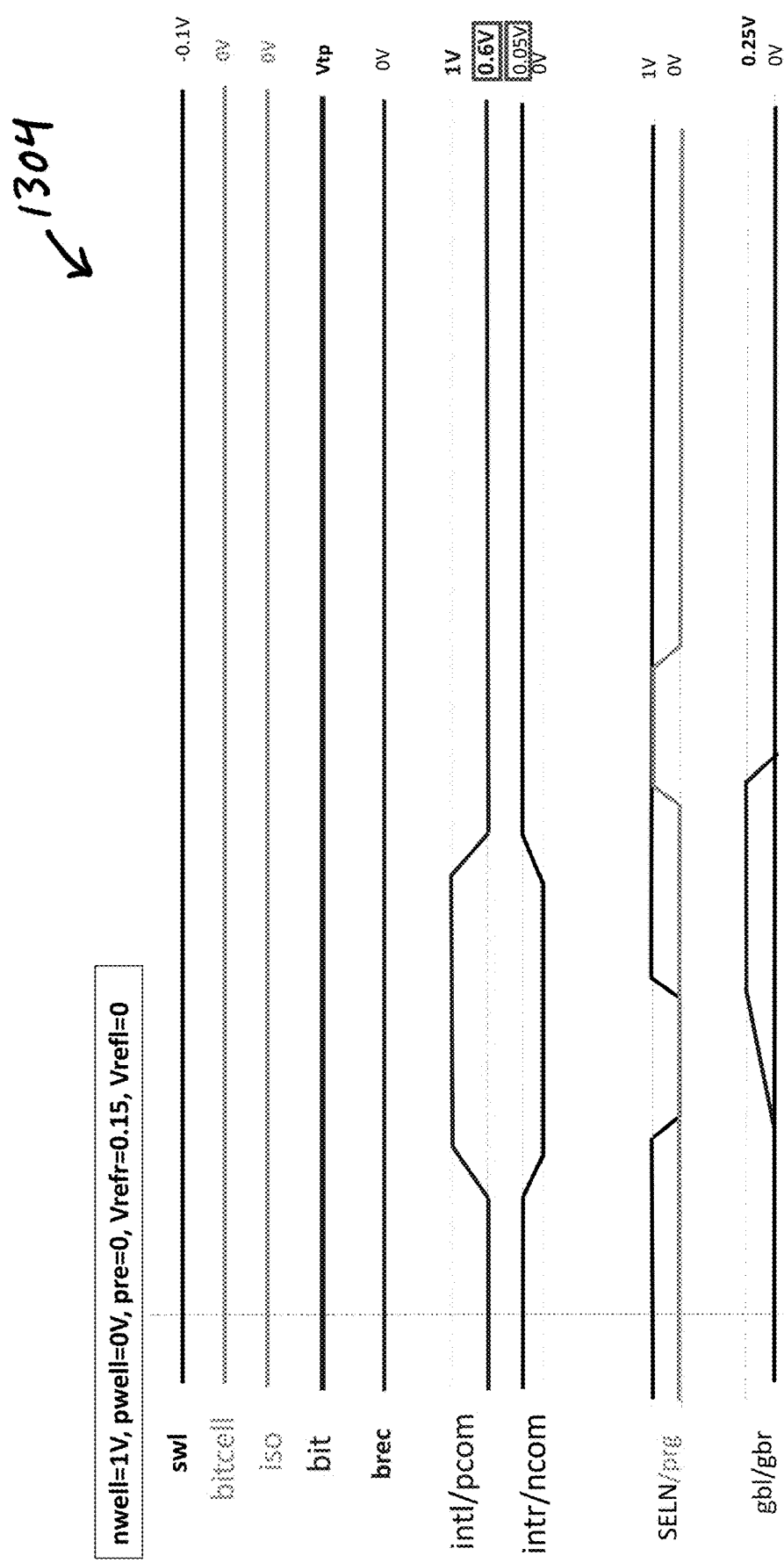
FIG. 18 is a timing diagram for the sense amp of FIG. 13 for a column read stored (logic 1) operation.
Figure 19:
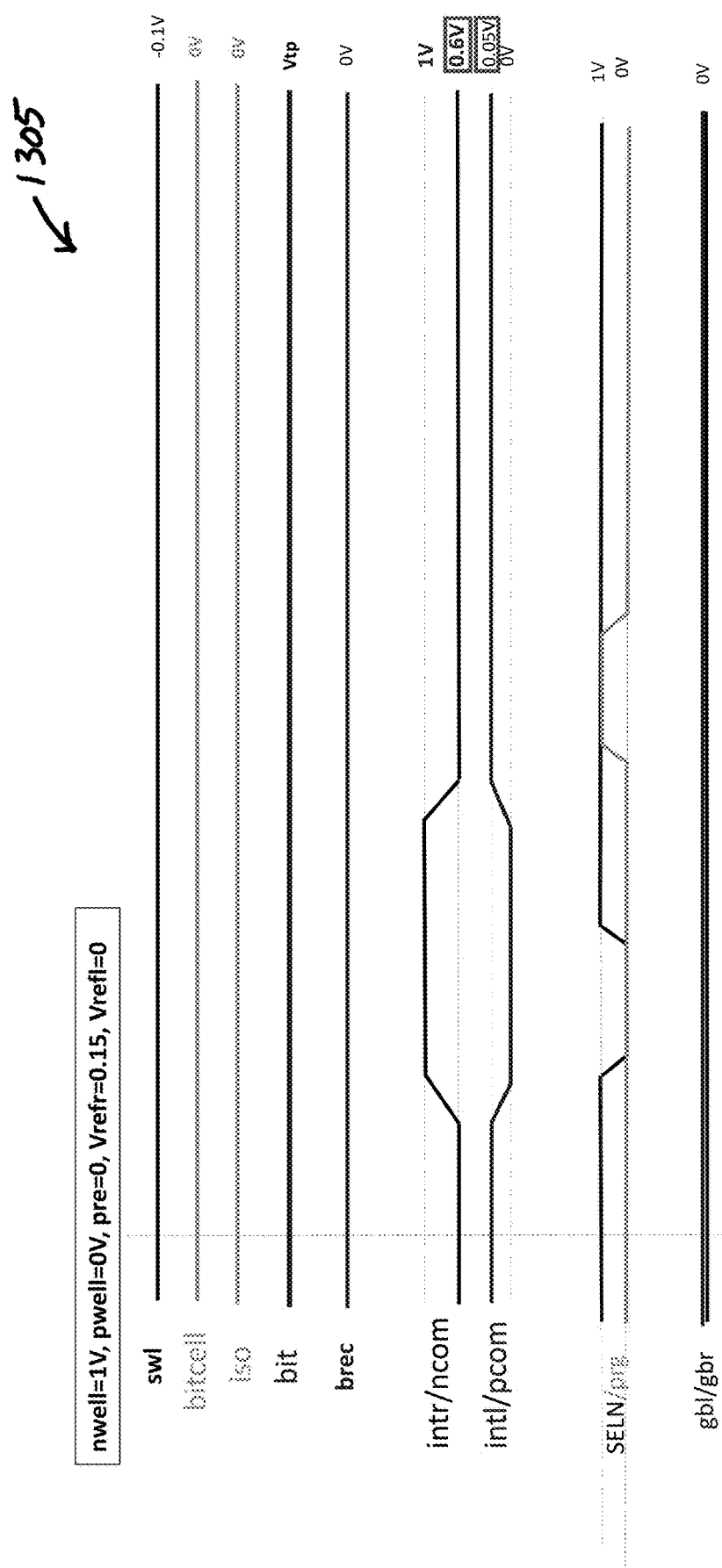
FIG. 19 is a timing diagram for the sense amp of FIG. 13 for a column read (stored logic 0) operation.
Figure 20:
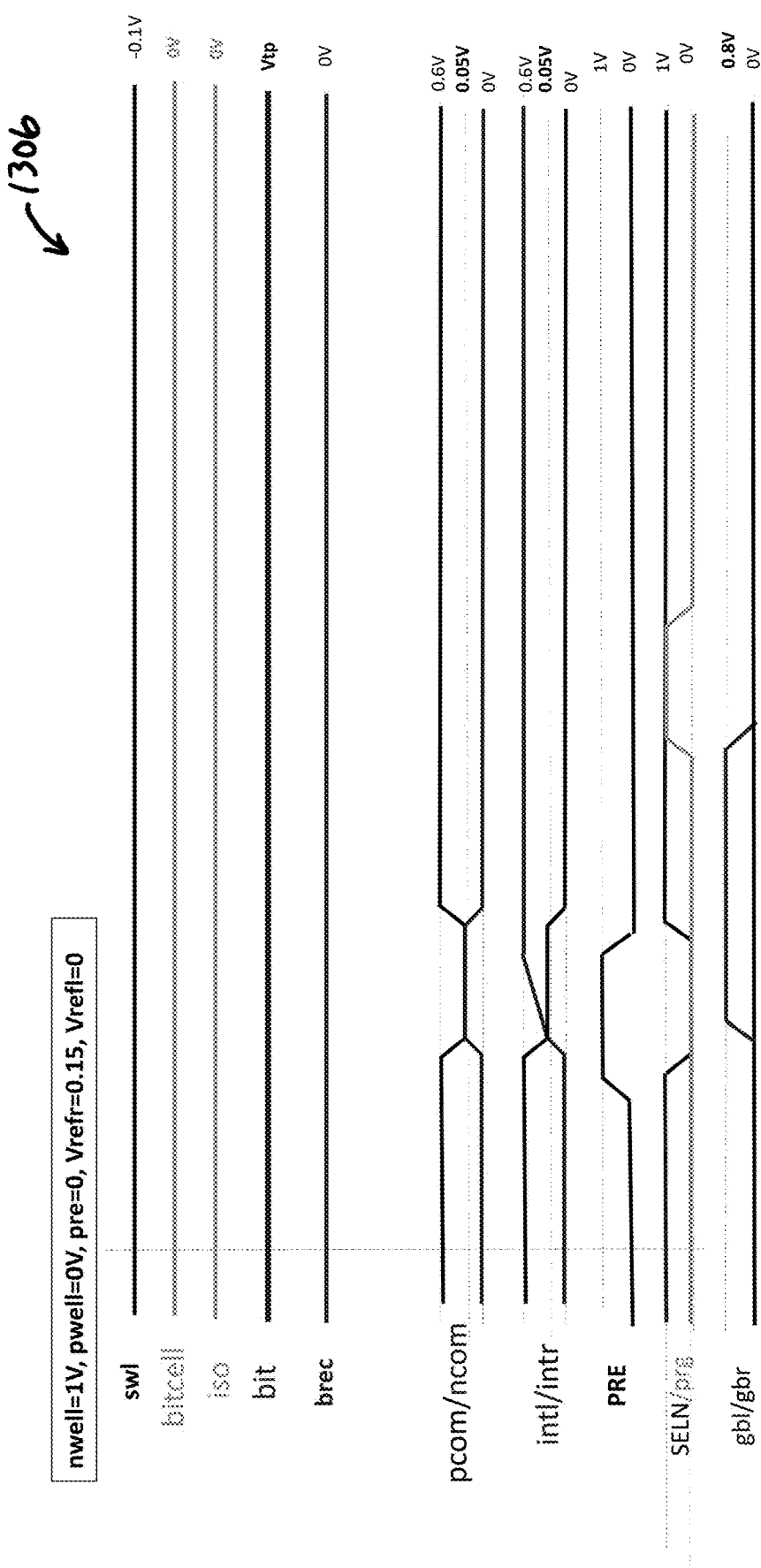
FIG. 20 is a timing diagram for the sense amp of FIG. 13 for a column write (logic 1) operation.
Figure 21:
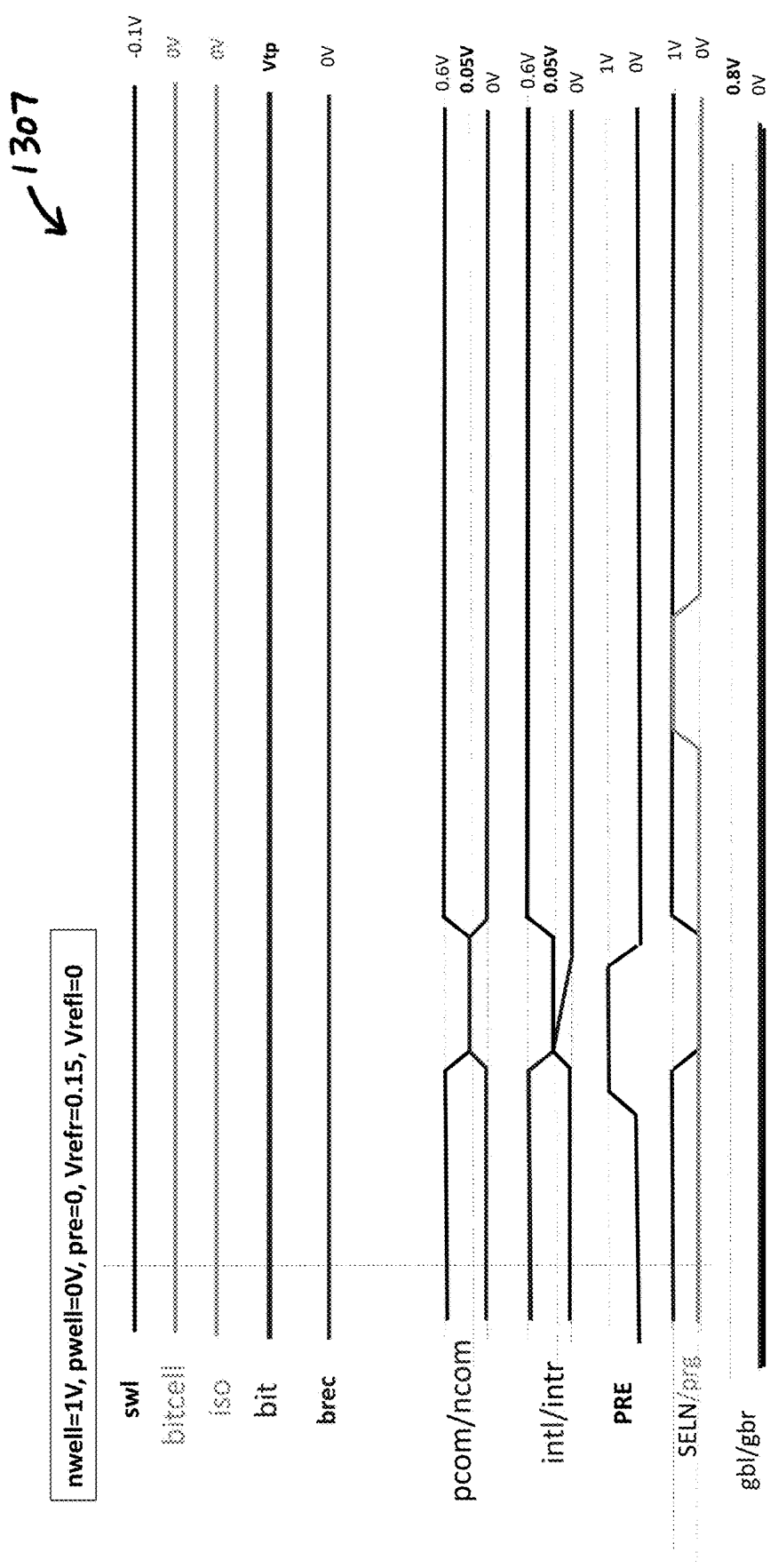
FIG. 21 is a timing diagram for the sense amp of FIG. 13 for a column write (logic 0) operation.

Activate write logic 1 and logic 0 to the bit cell are shown in the timing diagrams 1302, 1303 of FIGS. 16 and 17, respectively. Read Modify Write (RMW) operations are implemented with column writes to the sense amps of the selected columns after the selected SWL has been downloaded (read) into the sense amps. There may be more than one word written to some of the sense amps for a given physical SWL before writing back the full set of sense amps to the bit cells in the SWL. This full set would include the newly written sense amps as well as the so-called "half-cells", which are the locations in the SWL which remain untouched during the RMW operation. The actual write back operation during this type of activate cycle may therefore skip the read operation. This helps simplify the timing and potentially allows a faster activate cycle for write back as well.

Turning now to FIGS. 18-21, respective timing diagrams 1304, 1305, 1306 and 1307 for column read stored logic 1, column read stored logic 0, column write logic 1, and column write logic 0 for the sense amp architecture 1000 of FIG. 13 are shown. DRAM sense amps are treated similarly to SRAM bit cells. That is, given the Vrefr bias level near Gnd, an SRAM read operation is flipped relative to a normal SRAM which has NMOS pass gates and bit lines biased near Vdd for a variety of reasons. For SRAM bit cells, there is a tradeoff between writability and cell stability during reads. In the present example, having control of PCOM and NCOM allows a relatively large stability margin for reads as long as PCOM and NCOM are put into high impedance during the initial sampling of the write data from the global lines through the SELN transistors in the column write operation.

Figure 22:
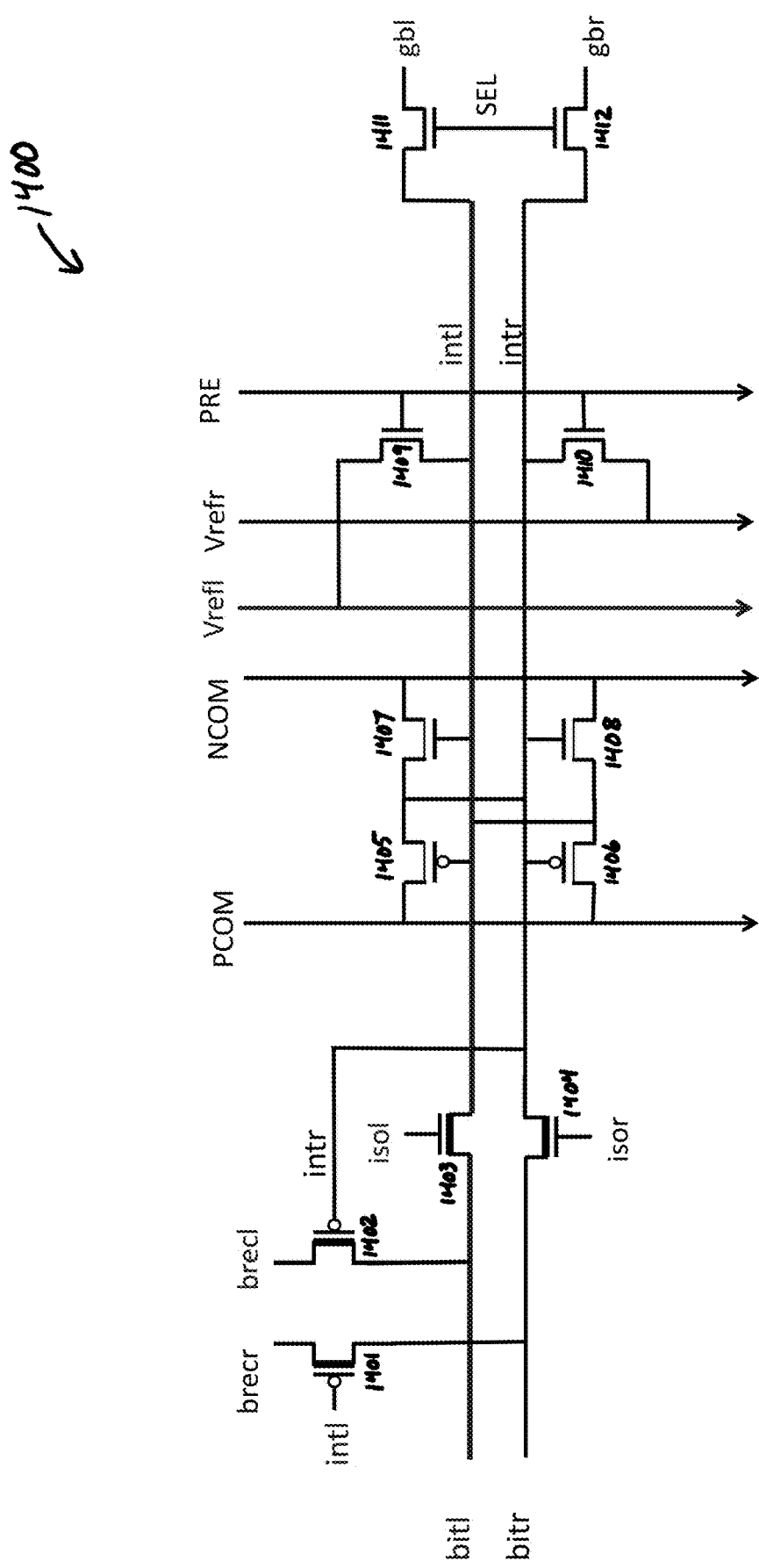
FIG. 22 is a schematic diagram of an alternative sense amp architecture in accordance with an example embodiment which may be used in the DRAM of FIG. 7.

Another example implementation of a sense amplifier 1400 is shown in FIG. 22. The sense amp 1400 includes transistors 1401-1412. This configuration also applies the above-described technique of a relatively low Vref to a DRAM. In this configuration, the generation of Vref is based upon charge sharing between active and reference bitlines during pre-charge.

Referring again to FIG. 13, as noted above, the example architecture of the sense amp 1000 is geared to leverage several of the technical advantages of MST films. One such advantage is Vt mismatch. More particularly, DRAMs have been fighting statistical mismatch in the primary sense amp for a long time. MST provides a relatively clean dielectric surface for transistors, which leads to a ~2× reduction in Vt mismatch for differential pairs. For the p-channel pair 1200/1201, they may be standard Vt devices, since they are operated with sufficient overdrive during initial sensing. For the n-channel pair 1202/1203, they should be as low Vt as possible during initial sensing, since the advantages of the single-ended scheme increase as Vrefr is lowered, e.g., to 50 mV or less. The source of this pair may be pushed below ground during initial sensing by one of several known techniques, but ideally this needs to be kept to 100-200 mV, well below the forward bias voltage of the S/D diodes.

Another technical advantage of the MST film leveraged by the present architectures is the ability to hold off 200-300 mV more voltage on the drain with the same reliability performance (overdrive). This is significant to the sensing scheme, since the higher the stored logic 1 can be made in the bit cell, the longer the refresh interval can be made. This comes into play primarily for bit cell pass gate 1212. By being able to bump this voltage above Vddp during the last portion of the write/restore operation, the magnitude of this bump that may be reliably achieved determines the maximum voltage level that may be written into the cell, which directly adds to the refresh interval. Another benefit may be the ability to implement transistors 1210 and 1211 with thin oxide devices (as opposed to the high voltage devices shown), which may reduce cost by eliminating thick oxide, high voltage devices from the periphery (since 1212 is an entirely different type of transistor than the peripheral transistors) provided such thick oxide devices are not needed elsewhere (e.g., in I/O devices or analog circuits such as voltage regulators).

Still another technical advantage of the MST film leveraged by the present architectures is higher mobility (current drive). That is, the present architecture leverages the capabilities of MST films to enable significantly faster DRAM operation. More particularly, with respect to the bit cell pass gate 1212, increasing the current drive of this transistor creates a significant improvement in both read and write speed of the activation and refresh operations. Furthermore, a significantly different pre-charge scheme is provided with transistors 1204/1205. That is, typical DRAMs take a relatively long time to pre-charge to approximately Vdd/2, since the gate voltage overdrive of the pre-charge device(s) is limited to Vddbit/2−Vt vs. Vddbit−Vt in the present example. For standard Vt devices (which are required in order minimize leakage), this could be a factor of 3-5×, which will create a significant speed improvement for the pre-charge portion of the cycle.

The present architecture also leverages the technical ability of MST films to hold off 200-300 mV more voltage on the drain with the same reliability performance (overdrive). As seen in FIG. 7, another advantage of the overdrive capability is that Vdd2 may be reduced from 1V to 0.7V in the entire periphery, cutting power in half for all of these blocks. In such applications, an MST film configuration may be selected to enable lower voltage than 0.7V (shorter channel, thin oxide) yet can be overdriven to 0.7V to match the speed of baseline transistors at 1V.

Furthermore, the technical advantage of MST films to control back gate effect with implant profiles may also be leveraged in the present architecture. This may be particularly so for the NMOS cross-coupled devices 1202/1203 in the sense amp, where it is desirable to sense with very low Vt due to reduced headroom, but then drive Vt much higher when not sensing in order to minimize leakage. The cross-coupled p-channel pair 1200/1201 may benefit from this to some extent as well.

Figure 23:
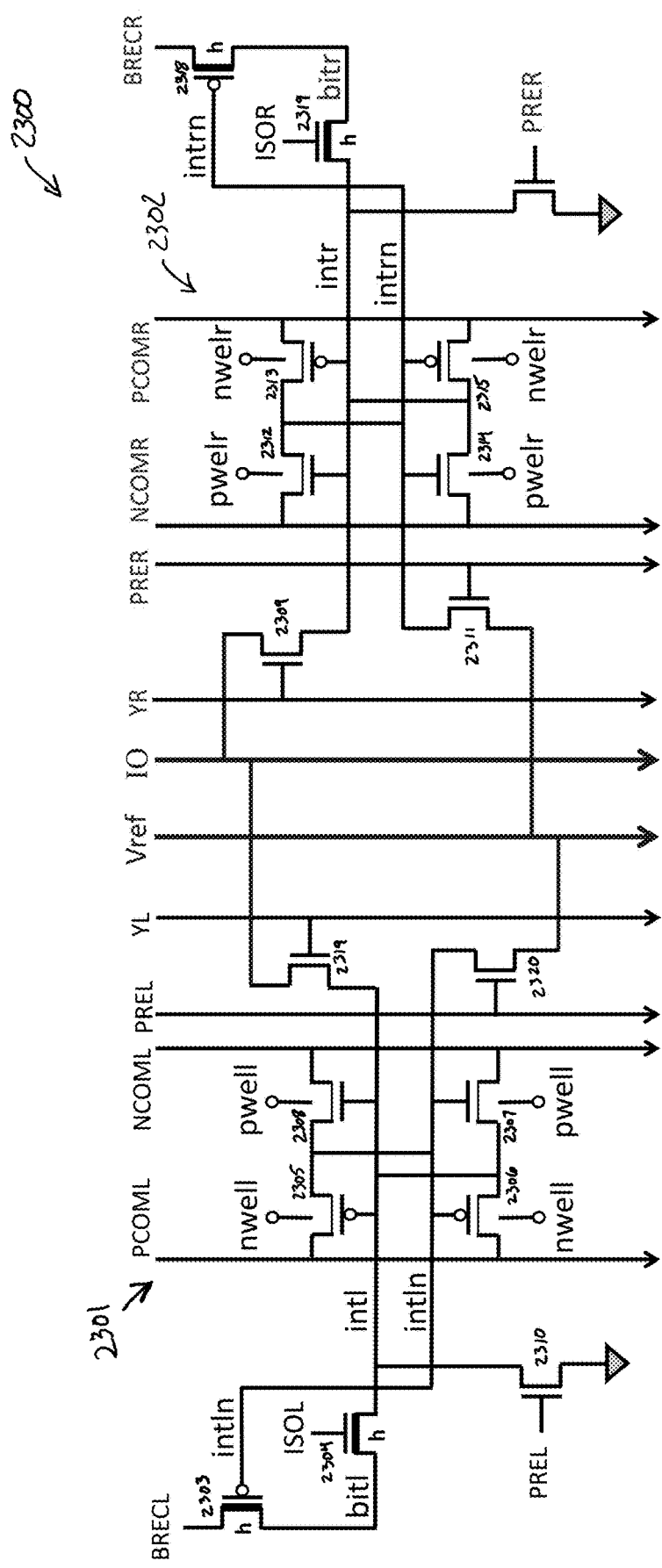
FIG. 23 is a schematic circuit diagram of a dual sense amp configuration in accordance with an example embodiment.
Figure 24:
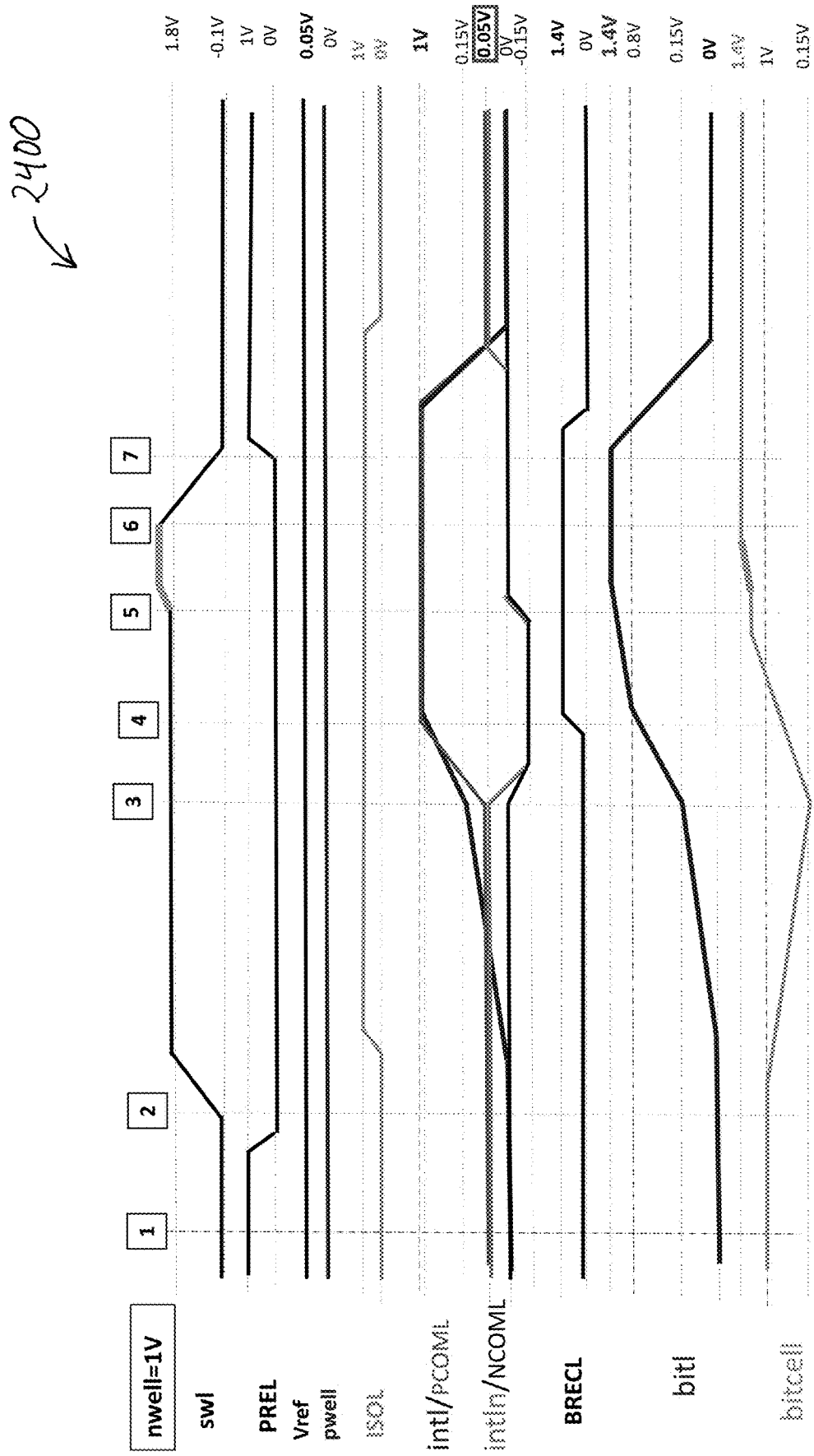
FIGS. 24 and 25 are activate read/refresh timing diagrams for the circuitry of FIG. 23 for a stored logic 1 and 0, respectively.

Turning now to FIG. 23, in another example embodiment sense amp circuitry 2300 illustratively includes left and right sense amps 2301, 2302. More particularly, the sense amp circuitry 2300 illustratively includes transistors 2303-2320. Operation of the left sense amp circuitry 2301 corresponding to an activate read/refresh stored logic 1 is now described with reference to the timing diagram 2400 of FIG. 24. Time 1 corresponds to the rising edge of an external clock to chip (not shown). This latches in all address and control information for the operation in this clock cycle. Moreover, this decodes the swl address and determines whether it is a Read Activation or a refresh operation, which in turn informs the control logic for the other signals that will be sequenced in this cycle. At time 2, precharge is turned off, and swl and ISOL are turned on. This enables charge sharing between cell high level at the end of the refresh interval to bit and intl. The final value should have enough margin vs. Vref to accurately sense a high level under all PVTs and variations. By way of example, ISOL may be run from normal Vdd2 (1V or less) since BRECL pulls bit all the way up to 1.4V for recovering a high level. This may be desirable to provide some resistive isolation between sense amp internal nodes and large capacitor bit lines during initial sensing as well.

At time 3, the sense amp is latched by pulling PCOM high and NCOM low. PCOML may either be much lower than Vdd2 to save power, or using Vdd2 for this may not have much of an overall power penalty. NCOML should go below ground to provide headroom for sensing with cross-coupled n-channels to the low Vrefr level. This may either be the swl off level (−100 mV) or further negative. At time 4, BRECL is turned on to complete pulling the bit line to a full high level (1.4V or so depending on reliability considerations, and higher when possible). With high voltage devices for ISOL and BRECL, this allows the cross-coupled latch in left sense amp 2301 to operate with higher performance, remove lower Vt thin oxide devices at levels at or below Vdd2 (1V or less). Also, this potentially allows a lower value for Vdd2 itself.

At time 5 after initial sensing is guaranteed, NCOML is pulled sharply back up to Gnd. NCOML is strongly coupled to SWL for this brief time, and SWL is kicked higher by a small amount to squeeze the most charge possible to write or recover a one level back to the bit cell. NCOML also needs to be pulled back up to zero to make sure Gnd is stored as the low level in the cell when writing a zero to help minimize leakage of the swl device, which has Vgs=−100 mV when off. More particularly, it is desirable not to leak the bit line when reading a logic 1 on a different swl on the same physical bit line.

At time 6, swl is shut off, and at time 7 BRECL is turned off and Precharge is turned on. This leaves the sense amp circuitry 2300 in a "pristine" precharged state when not being accessed. The active side (intl, bitl) is precharged to Gnd (0V), and the reference side (intln) is precharged to reference level Vref (nominally 50-75 mV).

Figure 25:
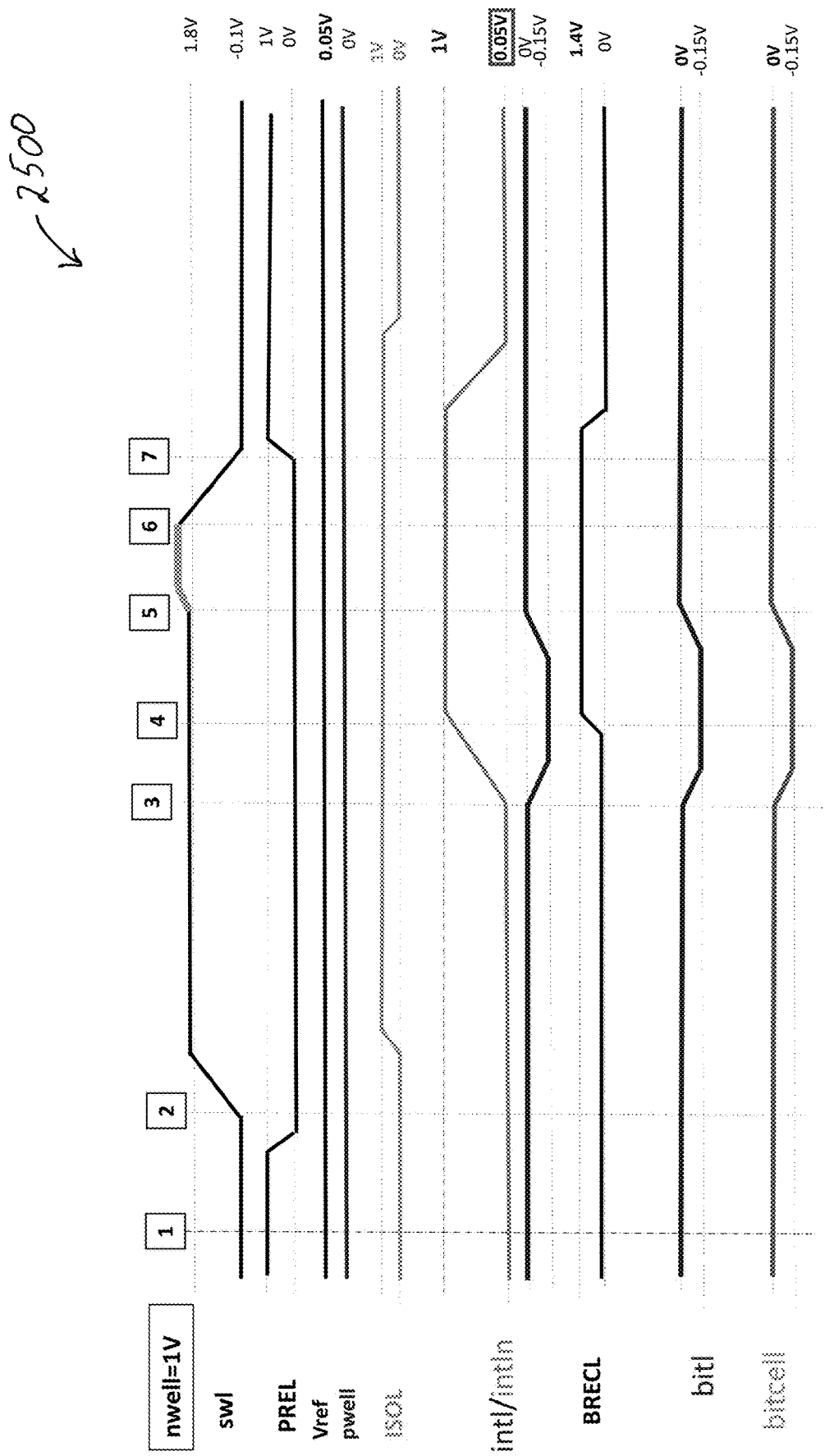

Referring additionally to the timing diagram 2500 of FIG. 25, the activate read/refresh for a stored logic 0 is now described. The timing is the same as described above with reference to the timing diagram 2400, but no read current demands are put on a stored 0. Generally speaking, Gnd is the most reliable voltage on the chip, if noise sources are handled properly (isolation, mainly). In the present example, Vref is shown as 50 mV. With regard to the stored logic 0 level in the bit cell, going slightly negative would increase the sensing margin for a zero. However, the countervailing issue is that no leakage current from multiple stored 0's on a physical bit line should allowed, which could degrade the sensing margin for reading a logic 1 from a different swl at the end of the refresh interval. The worst case test for this would be reading a logic 1 with stored 0's on all (say 255) of the bit cells on the same physical bit line at a high temperature.

Figure 26:
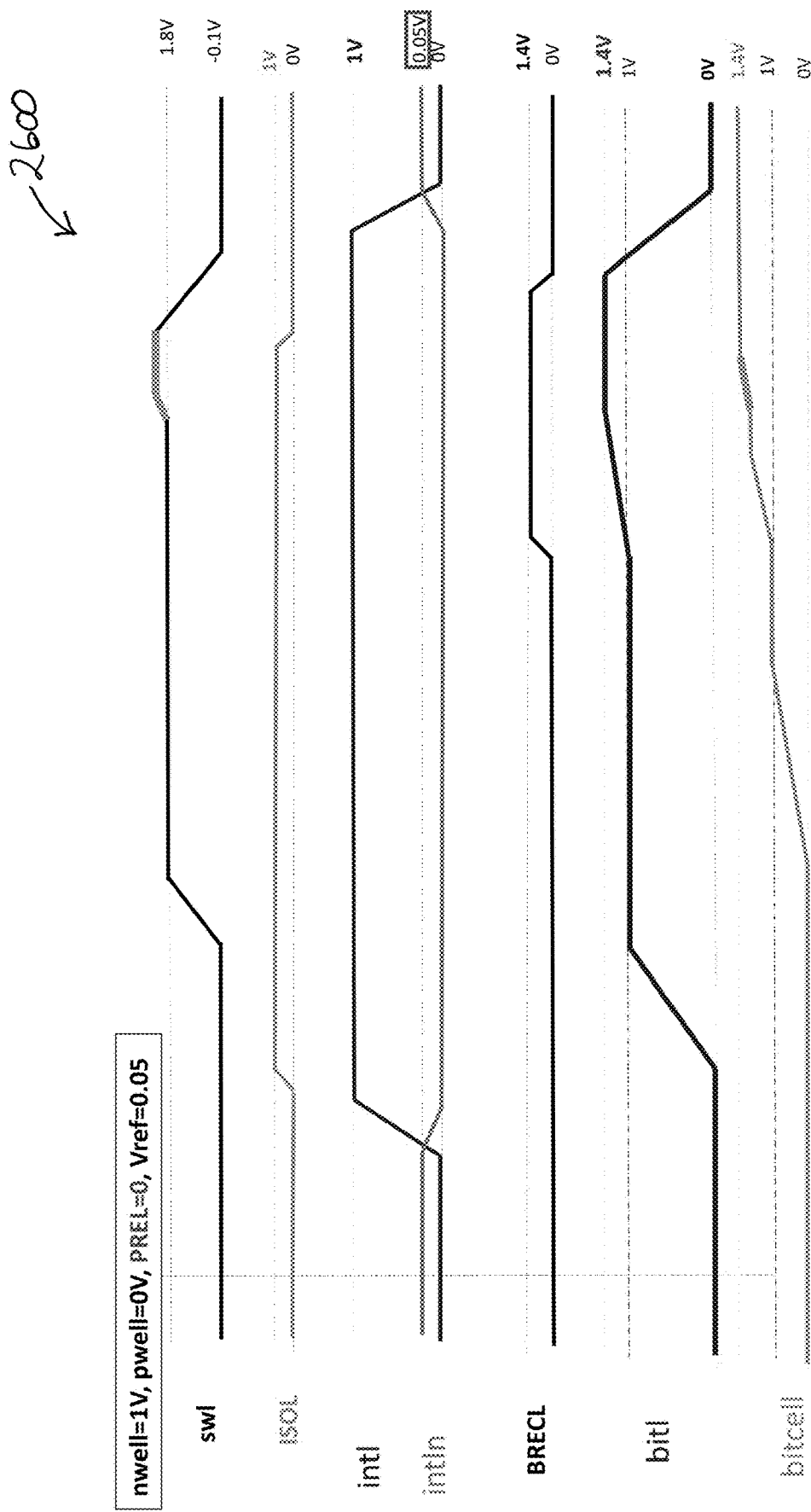
FIGS. 26 and 27 are activate read/refresh timing diagrams for a stored logic 1 and 0, respectively, for the circuitry of FIG. 23.
Figure 27:
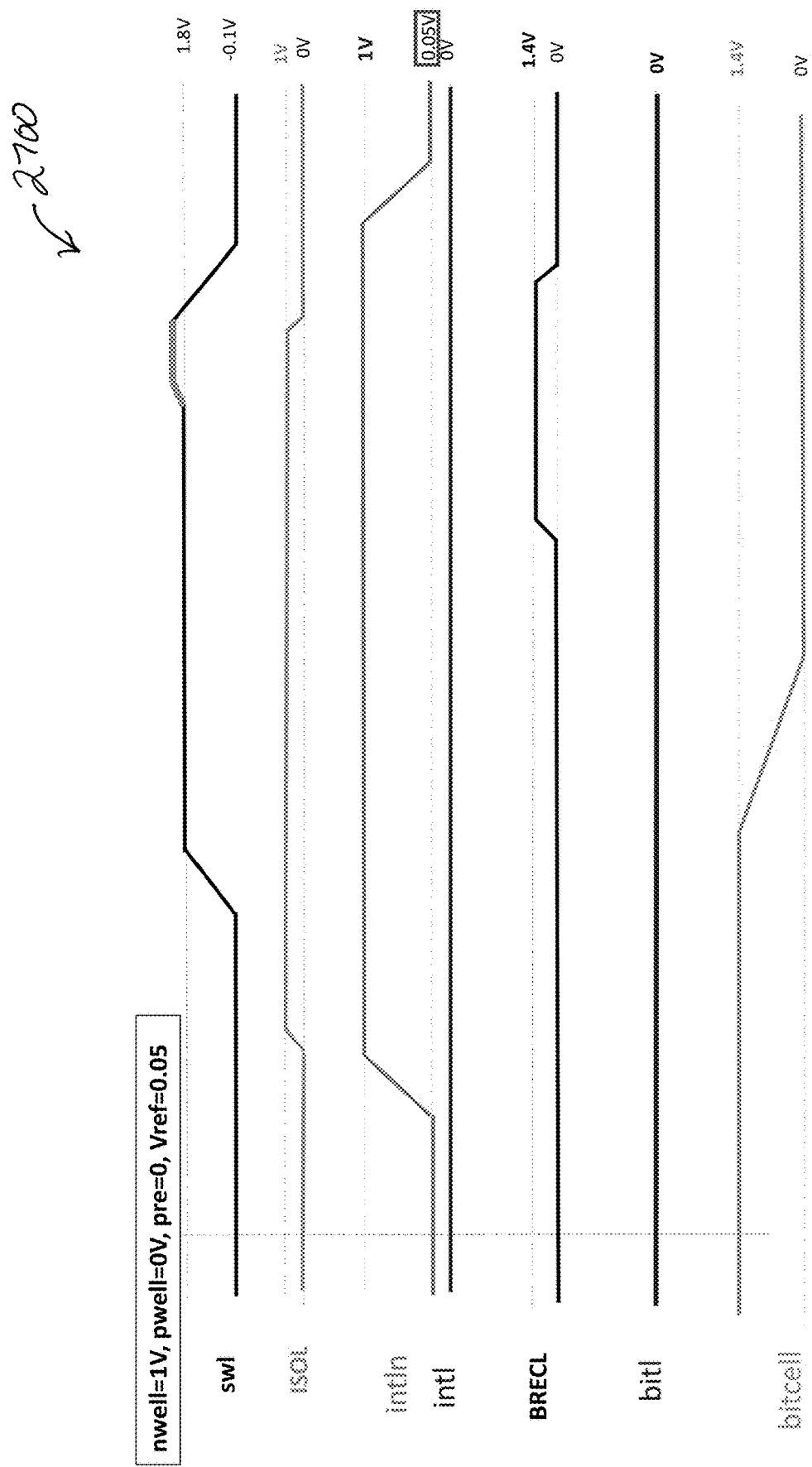
Figure 28:
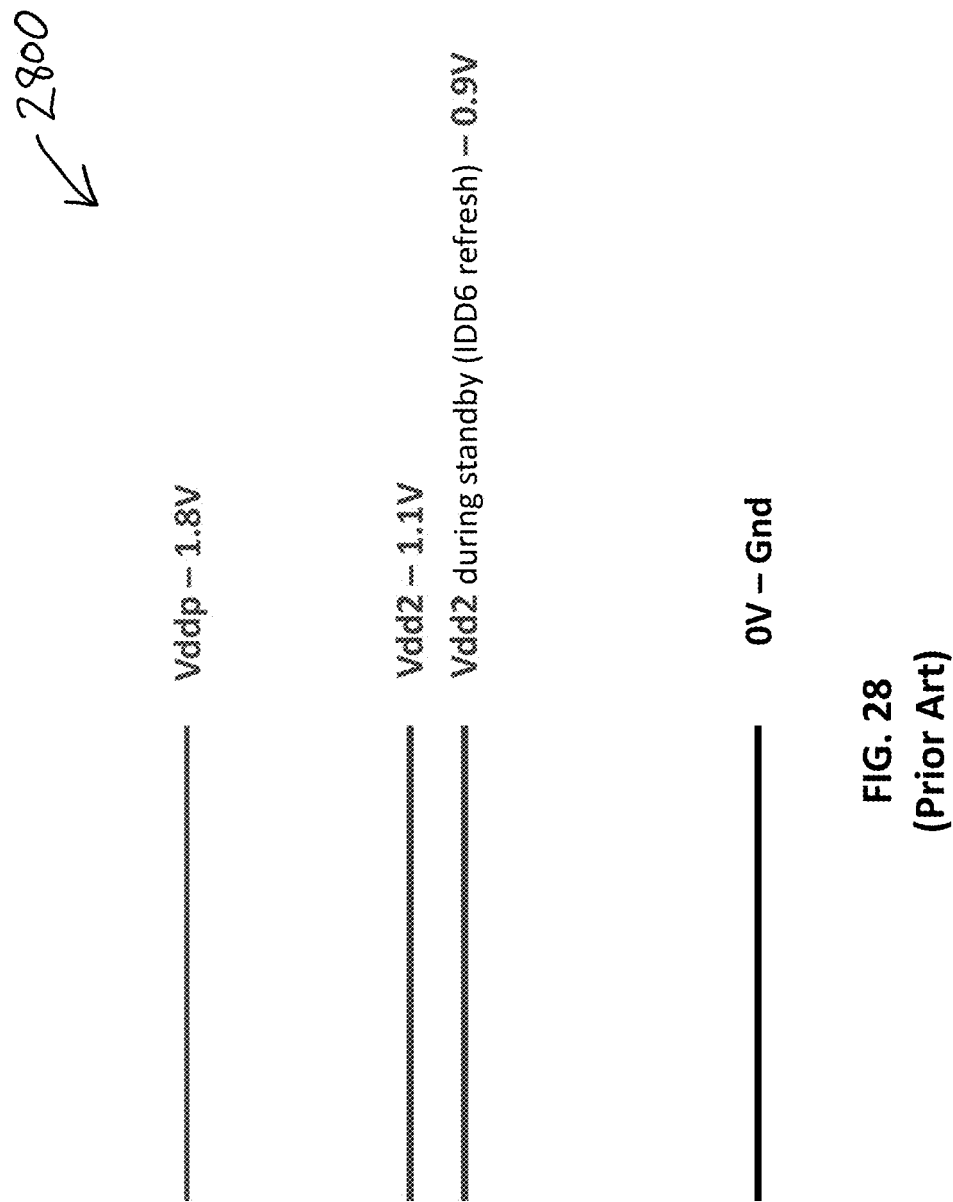
FIG. 28 is a voltage level diagram illustrating nominal external supply voltages for a DRAM of the prior art.
Figure 29:
FIGS. 29-31 are voltage level diagrams illustrating nominal external and internal supply voltages for a DRAM including an MST film in accordance with an example embodiment.
Figure 29:
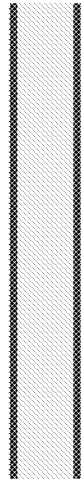
Figure 29:
Figure 30:
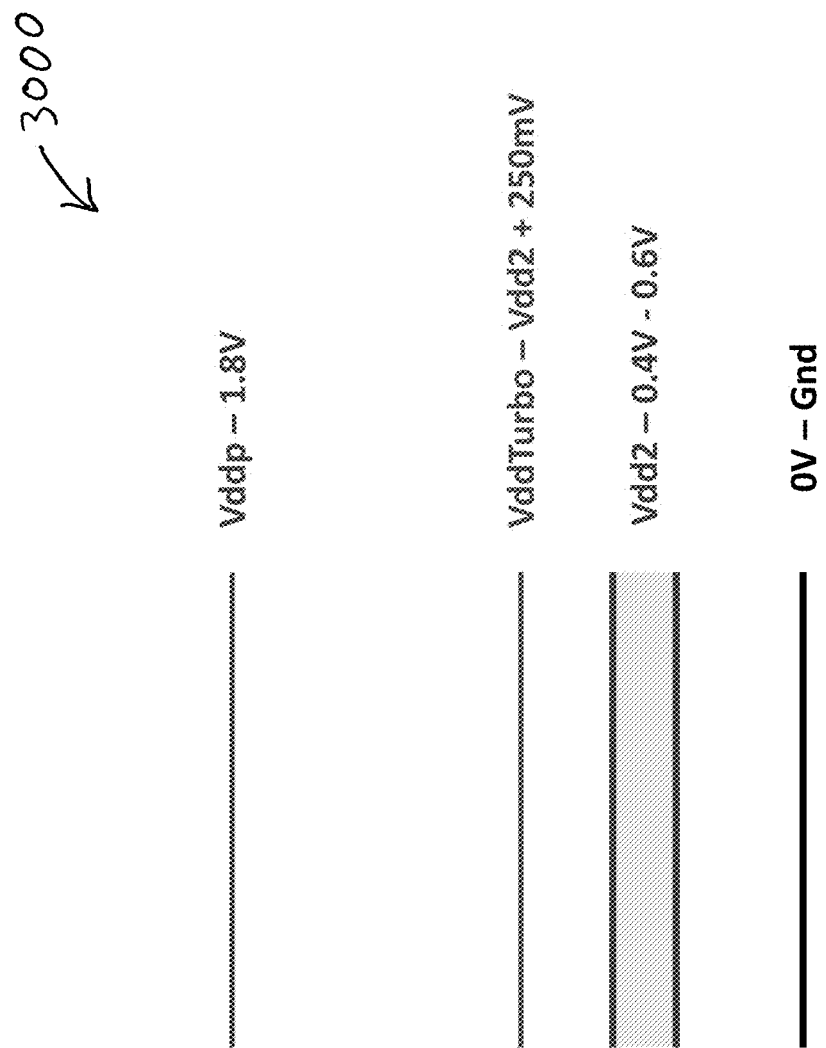
Figure 31:
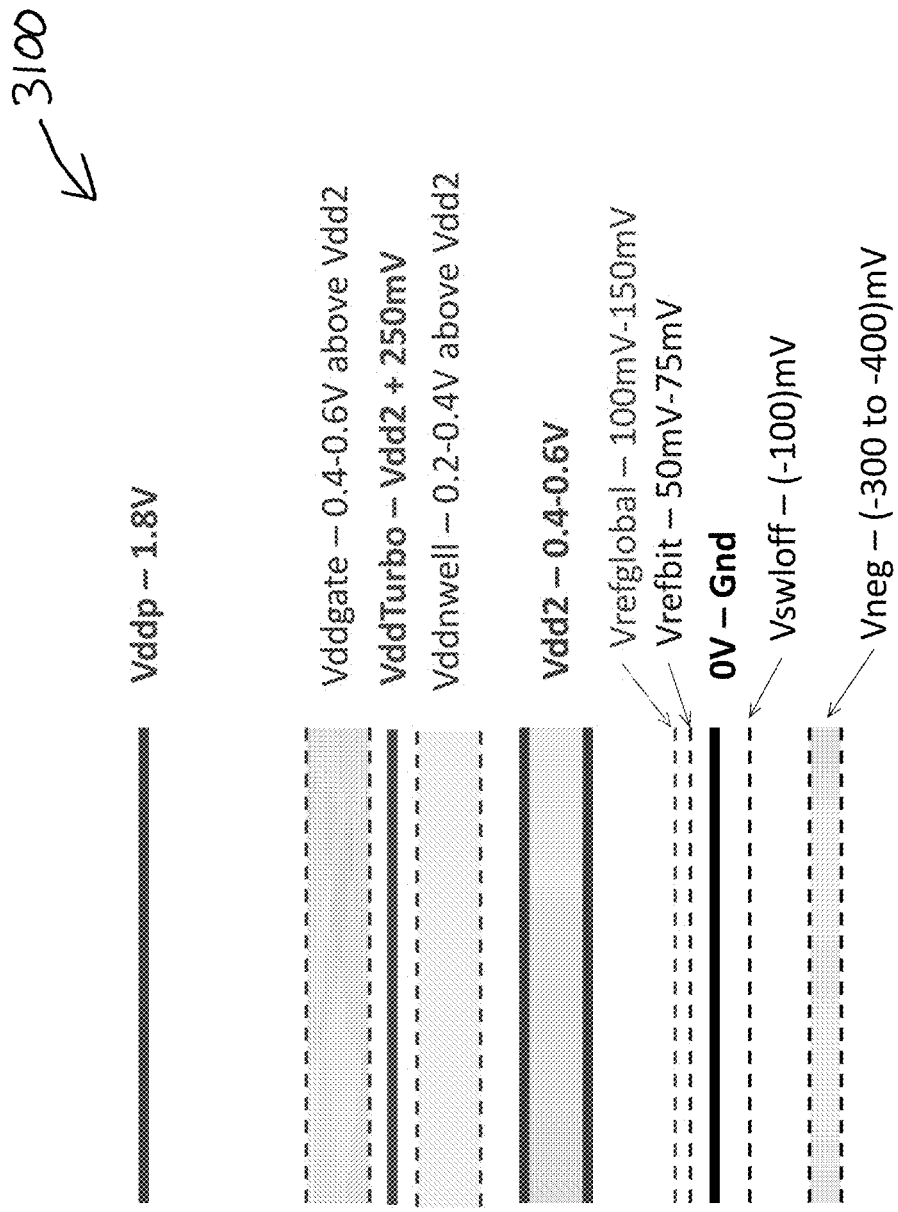

Activate write to the bit cell (single-ended) for the case of logic 1 and logic 0 are respectively shown in timing diagrams 2600 and 2700 of FIGS. 26 and 27.

Turning now to the voltage level diagrams 2800, 2900, 3000, and 3100 of FIGS. 28-31, respectively, an example supply voltage scheme for a DRAM including MST films as noted above is now described. By way of background, the diagram 2800 illustrates typical nominal external supply levels for a prior art DRAM. In this configuration, lowered Vdd2 during refresh reduces $CV^2f$ power to 0.81/1.21, assuming the refresh interval stays the same. Reduced noise may account for some of this reduction feasibility, but margins may be tighter when measuring IDD6 at lower Vdd2.

By way of comparison, an example nominal external supply configuration for a DRAM with MST films is shown in the voltage level diagram 2900. Here, Vddp may be the same as in the conventional configuration in the SWL path where this voltage is primarily used. The same MST film may be used for these devices as for low voltage MST devices, if desired, although different MST films may also be used in some implementations. However, the Vdd2 range achievable due to evolution of MST optimized for low voltage is significantly lower than in the conventional configuration. By way of example, Vdd2 may be 0.6V, and more particularly 0.4V or less in some configurations. Vdd2 may also be binned for lower voltage (higher cost premium) during testing in some implementations, such as where the channel lengths of a particular wafer are shorter and can meet the same performance at lower Vdd2. The bulk of the current for decoding and data paths is provided from this external supply, and since refresh happens in the background of normal operation, this supply is invariant.

In the example configuration illustrated in the voltage level diagram 3000, VddTurbo having a value of Vdd2+250 mV is also provided. Although used very little in predecoding and data paths, VddTurbo may be used for gate array logic and an ASIC chip under the DRAM stack. Switching from Vdd2 to VddTurbo may be done "on the fly" for particular logic blocks that can operate either in "Normal" or "Turbo" modes.

MST films have the capability to maintain or even improve performance at such reduced voltage and power. Nominal $CV^2f$ power reduction may be at least 0.36/1.21 (minus a small overhead to generate the additional internal voltages discussed below with reference to the voltage level diagram 3100), since most of the current is drawn from Vdd2. Examples of such devices which may benefit from the inclusion of MST films include high voltage devices for SWL path (which may use the same film as low voltage devices in some embodiments). Similar requirements apply as the baseline apply, with the exception of brief overvoltage on swl during final charge squeeze into bitcell. Other devices which may benefit from the MST film include: high Vt "1V" devices for headers and low leakage situations; and low Vt "0.6V" devices (optimized for Vdd2 level), but which can also operate in a "Turbo" mode with 200-300 mV overdrive to increase current drive by 50% or more, for example.

Further example internal supply ranges are shown in the voltage level diagram 3100. Vddgate is used for NMOS pullup drivers of long lines where a relatively low current is needed. Vddnwell is used selectively on headers and certain non-speed-sensitive circuits to minimize leakage by raising Vtp (relatively low current). Vrefglobal is used to create differential sensing of single-ended long internal data lines (relatively low current). Vrefbit is used to create differential sensing of a single-ended bit line sense amp (relatively low current). Vswloff is used to create an off voltage of SWL (relatively low current).

Vneg is used to provide a large capacitor reservoir on the whole chip that will have switches (for noise isolation) to the various places used, particularly ncom in the bit line sense amp. It may also be used for PMOS gates driving long lines. Vneg has a medium current, but spikes filtered with a large bypass capacitor reservoir. A power management integrated circuit (PMIC) chip (which is relatively low cost) in the system may be used to simplify, reduce risk, and provide power savings in the DRAM chip. Moreover, this may be done while providing lower impedance drive, greater flexibility of voltage levels, and higher accuracy for the "internal" voltages described above.

Figure 32:
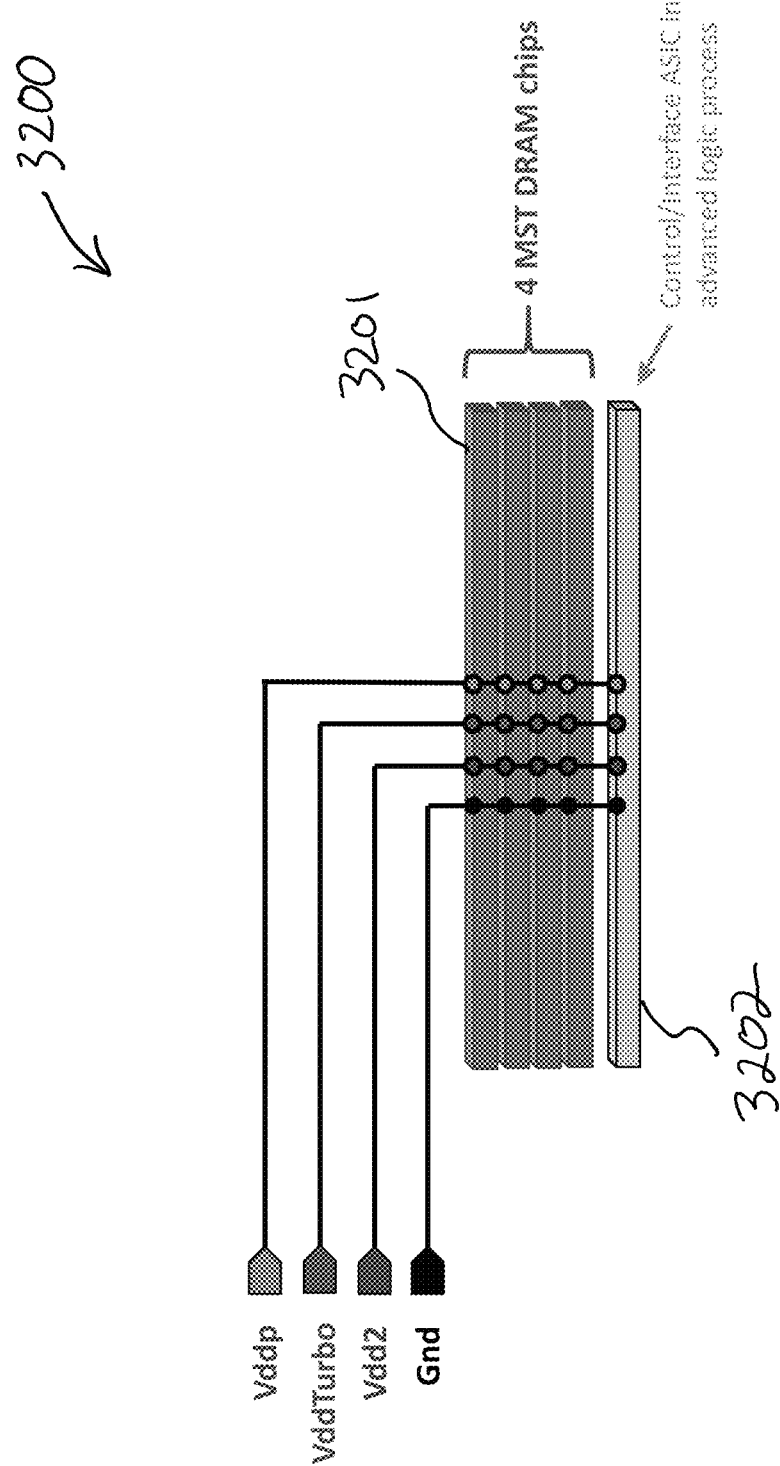
FIGS. 32 and 33 are schematic block diagrams of DRAM circuitry including DRAM chips with MST films in example embodiments.
Figure 33:
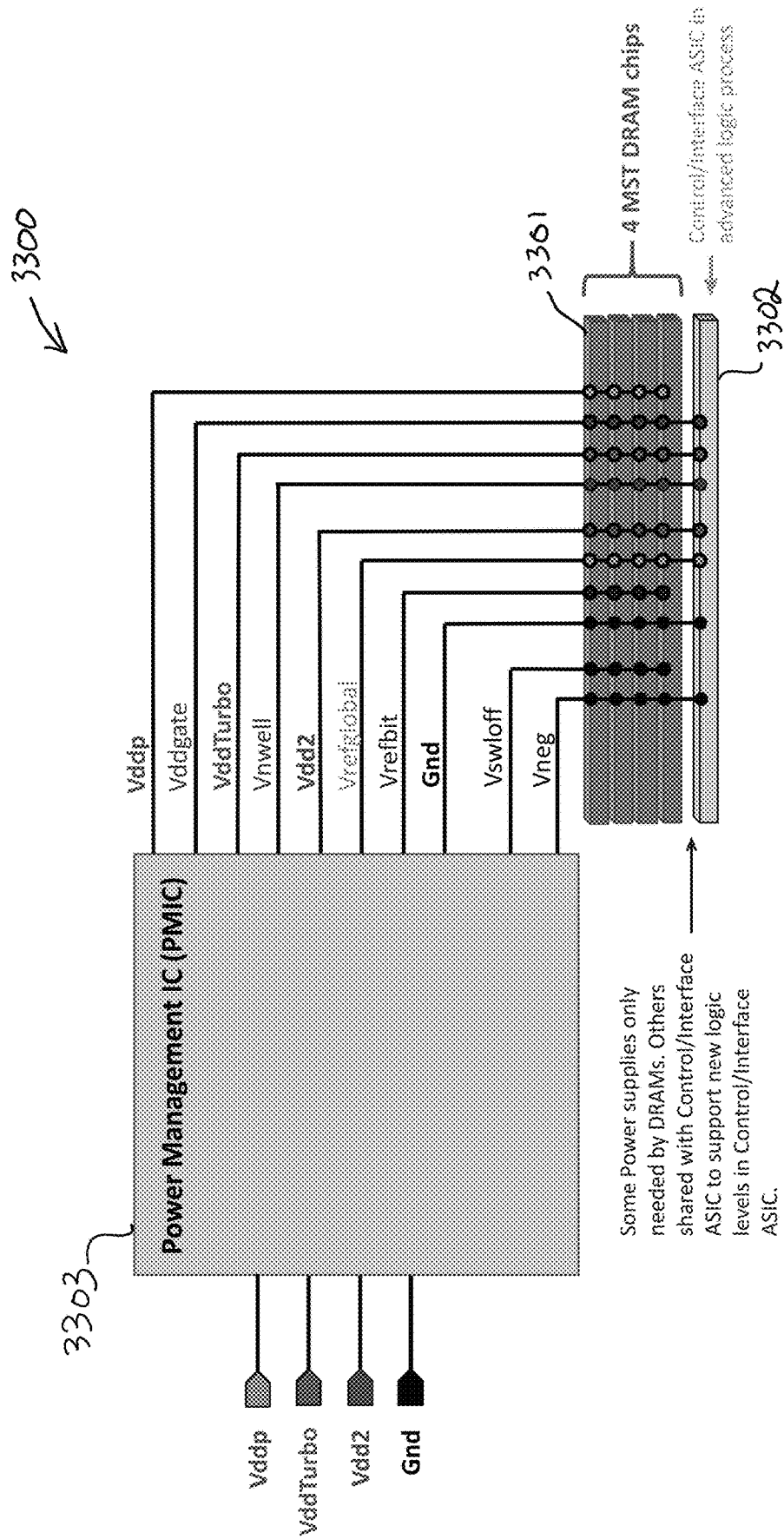

Turning to FIG. 32, an example DRAM assembly illustratively includes four MST DRAM chips 3301 (although other numbers of DRAM chips may be used in different embodiments) and a control/interface ASIC 3202. Another example DRAM assembly 3300 is shown in FIG. 33, which also illustratively includes four MST DRAM chips 3301 and a control/interface ASIC 3302, as well as a PMIC 3303.

Many modifications and other embodiments will come to the mind of one skilled in the art having the benefit of the teachings presented herein. Therefore, it is understood that the disclosure is not to be limited to the specific exemplary embodiments disclosed herein.

The invention claimed is:

1. A dynamic random access memory (DRAM) device comprising:
   a DRAM cell comprising a capacitor and a bit cell pass gate transistor coupling the capacitor to a bit line;
   a single-ended sense amplifier comprising:
      a cross-coupled transistor sensing circuit comprising a first p-channel transistor coupled between a first terminal and a first line, a first n-channel transistor coupled between the first line and a second terminal, the first p-channel transistor and the first n-channel transistor each having a gate coupled to a second line, a second p-channel transistor coupled between the first terminal and the second line, and a second n-channel transistor coupled between the second terminal and the second line, the second p-channel transistor and the second n-channel transistor each having a gate coupled to the first line;
a precharge circuit configured to selectively provide a first reference voltage and a second reference voltage to the first line and the second line, respectively;
a refresh circuit configured to selectively apply a third reference voltage to the bit line, wherein the refresh circuit is controlled by a voltage on the second line; and
a bit line transistor directly coupling the bit line to the first line of the cross-coupled transistor sensing circuit, wherein the bit line is the only bit line coupled to the cross-coupled transistor sensing circuit.

2. The DRAM device of claim 1 wherein at least one of the first p-channel transistor, the first n-channel transistor, the second p-channel transistor and the second n-channel transistor comprises:
spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

3. The DRAM device of claim 1 wherein the refresh circuit comprises a transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

4. The DRAM device of claim 1 wherein the precharge circuit comprises at least one transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

5. The DRAM device of claim 1, further comprising a programming circuit configured to provide write data to the first line and the second line during a write operation.

6. The DRAM device of claim 5 wherein the programming circuit comprises at least one transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

7. The DRAM device of claim 1, wherein each of the first p-channel transistor, the first n-channel transistor, the second p-channel transistor and the second n-channel transistor comprises:
spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

8. A dynamic random access memory (DRAM) device comprising:
a plurality of stacked DRAM integrated circuits (IC) each DRAM IC comprising
an array of DRAM cells, each DRAM cell configured to store a high logic voltage and a low logic voltage,
a precharge circuit configured to selectively provide a first reference voltage and a second reference voltage to a first line and a second line, respectively,
a sense amplifier comprising a cross-coupled transistor sensing circuit coupled between the first line and second line, the sense amplifier comprising at least one transistor comprising
spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, and
a refresh circuit configured to selectively couple a third reference voltage to a corresponding DRAM cell via the first line and based upon a voltage difference between the first line and the second line, the third reference voltage being greater than the high logic voltage of the DRAM cell.

9. The DRAM device of claim 8 further comprising a control IC coupled to the plurality of stacked DRAM ICs.

10. The DRAM device of claim 8 further comprising a power management IC coupled to the plurality of stacked DRAM ICs.

11. The DRAM device of claim 8 wherein the at least one transistor of the cross-coupled transistor sensing circuit comprises all transistors of the cross-coupled transistor sensing circuit.

12. The DRAM device of claim 8 wherein the refresh circuit comprises at least one transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

13. The DRAM device of claim 8 wherein the precharge circuit comprises at least one transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

14. The DRAM device of claim 8 further comprising a programming circuit cooperating with the refresh circuit to selectively couple the third reference voltage to the corresponding DRAM cell.

15. The DRAM device of claim 14 wherein the programming circuit comprises at least one transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

16. The DRAM device of claim 8 further comprising another refresh circuit configured to selectively couple a fourth reference voltage via the second line to another corresponding DRAM cell based upon a voltage difference between the first line and the second line.

17. The DRAM device of claim 1, wherein voltages applied to the first and second terminals are changed during an access to the DRAM cell.

18. The DRAM device of claim 1, wherein the refresh circuit comprises a transistor, wherein the transistor of the refresh circuit and the bit line transistor operate at higher voltages than the first p-channel transistor, the first n-channel transistor, the second p-channel transistor and the second n-channel transistor.

19. The DRAM device of claim 1, wherein the bit cell pass gate transistor comprises spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

20. A method for accessing a dynamic random access memory (DRAM) cell using a single-ended sense amplifier that reads a data value stored in the DRAM cell by sensing a voltage on a single bit line coupled to the DRAM cell, the method comprising:
    pre-charging a first terminal and a first line of a cross-coupled transistor sensing circuit to a first reference voltage and pre-charging a second terminal and a second line of the cross-coupled transistor sensing circuit to a second reference voltage, wherein the cross-coupled transistor sensing circuit comprises a first p-channel transistor coupled between the first terminal and the first line, a first n-channel transistor coupled between the first line and the second terminal, the first p-channel transistor and the first n-channel transistor each having a gate coupled to the second line, a second p-channel transistor coupled between the first terminal and the second line, and a second n-channel transistor coupled between the second terminal and the second line, the second p-channel transistor and the second n-channel transistor each having a gate coupled to the first line;
    activating a bit cell pass gate transistor of the DRAM cell, thereby coupling a charge stored on a capacitor of the DRAM cell to the single bit line;
    activating a bit line transistor directly coupling the single bit line to the first line of the cross-coupled transistor sensing circuit, wherein the charge stored on the capacitor of the DRAM cell is coupled to the first line of the cross-coupled transistor sensing circuit; and then
    activating the cross-coupled transistor sensing circuit by increasing the voltage on the first terminal to a third reference voltage, and decreasing the voltage on the second terminal to a fourth reference voltage, whereby the activated cross-coupled transistor sensing circuit latches a data value representative of the charge coupled to the first line of the cross-coupled transistor sensing circuit.

21. The method of claim 20, further comprising activating a refresh circuit to selectively apply a fifth reference voltage to the bit line when the activated cross-coupled transistor sensing circuit latches a data value representative of a logic high charge.

22. The method of claim 21, wherein the fifth reference voltage is greater than the third reference voltage.

23. The method of claim 21, wherein the refresh circuit comprises a transistor comprising spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

24. The method of claim 20, wherein activating bit cell pass gate transistor comprises:
    initially applying a first word line voltage to the bit cell pass gate transistor of the DRAM cell; and then
    capacitively kicking the first word line voltage higher.

25. The method of claim 20, wherein at least one of the first p-channel transistor, the first n-channel transistor, the second p-channel transistor and the second n-channel transistor comprises spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

26. The method of claim 20, wherein the bit cell pass gate transistor comprises spaced apart source and drain regions, a superlattice channel extending between the source and drain regions, and a gate overlying the superlattice channel, the superlattice channel comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

* * * * *